(12) United States Patent
Keane

(10) Patent No.: US 9,728,330 B2
(45) Date of Patent: Aug. 8, 2017

(54) RADIO FREQUENCY SWITCHING SYSTEM WITH IMPROVED LINEARITY

(71) Applicant: John Keane, County Cork (IE)

(72) Inventor: John Keane, County Cork (IE)

(73) Assignee: Ferfics Limited (IE)

( * ) Notice: Subject to any disclaimer, the term of this patent is extended or adjusted under 35 U.S.C. 154(b) by 0 days.

(21) Appl. No.: 14/742,409

(22) Filed: Jun. 17, 2015

(65) Prior Publication Data

US 2016/0006409 A1 Jan. 7, 2016

Related U.S. Application Data

(60) Provisional application No. 62/020,560, filed on Jul. 3, 2014.

(51) Int. Cl.
| | |
|---|---|
| *H01P 1/10* | (2006.01) |
| *H01F 38/14* | (2006.01) |
| *H03H 9/72* | (2006.01) |
| *H03H 7/46* | (2006.01) |
| *H01P 1/15* | (2006.01) |

(52) U.S. Cl.
CPC ............. *H01F 38/14* (2013.01); *H03H 7/465* (2013.01); *H03H 9/725* (2013.01)

(58) Field of Classification Search
CPC ..... H01P 1/15; H03H 9/02818; H03H 9/0004
USPC ................................................ 333/101, 103
See application file for complete search history.

(56) References Cited

U.S. PATENT DOCUMENTS

| | | | | |
|---|---|---|---|---|
| 7,847,655 | B2* | 12/2010 | Otani ........................ | H01P 1/15 333/101 |
| 8,103,221 | B2* | 1/2012 | Ta ............................. | H01P 1/15 333/101 |
| 8,570,235 | B2* | 10/2013 | Ahn ......................... | H01Q 1/50 333/103 |
| 8,803,632 | B2* | 8/2014 | Takeuchi ................. | H03H 7/38 333/101 |
| 9,209,775 | B2* | 12/2015 | Ebihara .................. | H03H 7/465 |

(Continued)

OTHER PUBLICATIONS

Mirus International Inc., How do non-linear loads create current and voltage harmonics?, www.mirusinternational.com, Jun. 2008, 2 pages.*

*Primary Examiner* — Dean Takaoka
(74) *Attorney, Agent, or Firm* — Tarolli, Sundheim, Covell & Tummino LLP

(57) ABSTRACT

A radio frequency (RF) circuit is described that comprises a plurality of switching arms selectively activatable and associated with corresponding RF input ports. A switch source impedance is associated with each of the RF input ports. The switch source impedance is frequency dependent with its value matched to a characteristic impedance value within a first frequency range. The value of the switch source impedance is not matched to the characteristic impedance value within a second frequency range. When an RF signal within the first frequency range is transmitted through the RF circuit, between one of the RF input ports and an a common port, an RF distortion voltage within a distortion frequency range results at the common port; and the amplitude of a resultant RF distortion voltage is lower than an RF distortion voltage if the switched source impedance is matched to the characteristic impedance within the second frequency range.

35 Claims, 15 Drawing Sheets

(56) References Cited

U.S. PATENT DOCUMENTS

| | | | |
|---|---|---|---|
| 9,380,640 B2 * | 6/2016 | Chen | H04N 21/42638 |
| 2005/0079828 A1 * | 4/2005 | Tasaka | H04B 1/48 |
| | | | 455/78 |
| 2009/0093270 A1 * | 4/2009 | Block | H04B 1/52 |
| | | | 455/552.1 |
| 2013/0344820 A1 * | 12/2013 | Ikonen | H04B 1/006 |
| | | | 455/78 |
| 2014/0321008 A1 * | 10/2014 | Keane | H01H 11/00 |
| | | | 361/56 |
| 2015/0070075 A1 * | 3/2015 | Keane | H03K 17/693 |
| | | | 327/389 |
| 2015/0091776 A1 * | 4/2015 | Gaynor | H03K 17/693 |
| | | | 343/860 |

* cited by examiner

RADIO FREQUENCY SWITCHING SYSTEM WITH IMPROVED LINEARITY

RELATED APPLICATIONS

This application claims priority from U.S. Provisional Patent Application Ser. No. 62/020,560, filed 3 Jul. 2014, which is incorporated herein in its entirety.

FIELD OF THE INVENTION

The present teaching relates to a Radio Frequency (RF) switching system with improved linearity.

BACKGROUND

RF switch modules are a key building block in front end of wireless systems and find many uses in applications such as mobile phones and wireless local area networks (LANs). Performance metrics such as low insertion loss, high linearity, high isolation, high power handling and switching time are critical in RF switch module design. Switch modules target at LTE cellular applications include a duplexer and a radio frequency switch integrated circuit (IC).

An RF switch may comprise multiple switching elements which control the flow of RF power between different points in a particular application. Switching elements are comprised of transistors that are stacked. The number of transistors in a stack is determined by the maximum RF voltage that can be developed across the complete stack and the maximum voltage that can be tolerated across an individual transistor without introducing limitations to either reliability or linearity performance of device. RF switch modules are subject to stringent linearity specifications which require tight limits on the level of distortion that a device can introduce on an RF signal. Linearity requirements may be expressed by specifying different parameters such as harmonics generation, intermodulation distortion (IMD2, IMD3) or intercept points, (IP2, IP3). Irrespective of how requirements are specified the linearity performance is determined by distortion sources within the RF transistor stacks and the interaction of these with impedances external to RF switch IC on the module. Adoption of 4G/LTE standards places an increasing demand on linearity requirements for the RF switch module. Carrier aggregation and diversity implementations mean that there may be multiple frequency bands simultaneously active leading to tighter linearity constraints where harmonics from one frequency band fall within another frequency band. Centre frequency for transmission of LTE Band 17 is 710 MHz. The $3^{rd}$ harmonic from this, 2.13 GHz, falls within the receive frequency range for LTE Bands 1 and 4. The harmonic distortion that can be introduced on Band 17 path by the RF switch module is required to be significantly less than previously required in other frequency bands. Existing design approaches cannot meet these linearity requirements without compromising on other performance parameters, particularly insertion loss.

There is therefore a need to provide an RF switching system which addresses at least some of the drawbacks of the prior art.

SUMMARY

These and other problems are addressed by providing an RF switch as detailed in claim 1. Advantageous embodiments are detailed in the subsidiary claims.

In one aspect there is provided a radio frequency (RF) circuit comprising: a plurality of switching arms associated with corresponding RF input ports; the switching arms being controllable to be selectively activated; and a switch source impedance associated with each of the RF input ports; the switch source impedance being frequency dependent such that its value is matched to a characteristic impedance value within a first frequency range; and the value of the switch source impedance is not matched to the characteristic impedance value within a second frequency range; wherein when an RF signal within the first frequency range is transmitted through the RF circuit, between one of the RF input ports and an a common port, an RF distortion voltage within a distortion frequency range results at the common port; and the amplitude of a resultant RF distortion voltage is lower than an RF distortion voltage if the switch source impedance is matched to the characteristic impedance within the second frequency range.

In another aspect, the second frequency range and distortion frequency range are coincident, occuring at an integer multiple of the first frequency range.

In a further aspect, the distortion frequency range occurs at a sum of an integer multiple of the first frequency range and an integer multiple of the second frequency range.

In one exemplary arrangment, the impedance value of the source impedance is lower than the characteristic impedance value when the RF signal is outside the transmitting frequency range.

In another example, the impedance value of the source impedance is higher than the characteristic impedance value when the RF signal is outside the transmitting frequency range.

In a further arrangement, the common port is associated with the source impedance.

In one aspect, when one of the switching arms is in an active state one or more of the other switching arms are in an inactive state.

In another aspect, a high linearity switching arm is configured such that it generates harmonic power in load which is lower than the harmonic power in load for the whole RF circuit.

In a further aspect, the RF input ports associated with the inactive switching arms are terminated with an impedance value corresponding to the characterisitic impedance value.

In one aspect, at least one switching arms is operably coupled to a common antenna port.

In another aspect, one or more of the switching arms coupled to the common antennna port are in an inactive state when the high linearity switching arm is in an active state.

In one exemplary arrangment, harmonic power in load due to the switching arms in an inactive state is reduced by providing a low impedance element at the RF input port associated with the high linearity switching arm at harmonic frequencies.

In another aspect, a low impedance element is coupled to the RF input port associated with the high linearity awitching arm for reducing harmonic power in load due to the inactive switching arms.

In a further aspect, harmonic power in load due to the active and inactive switching arms is controllable by varying the characteristic impedance.

In one aspect, harmonic power in load due to the active and inactive switching arms is controllable by varying the source impedance.

In another aspect, the switching arms are configured such that ratio of harmonic power in load due to the inactive switching arms when their associated RF input ports are terminated with the a characteristic impedance value and the harmonic power in load for complete RF circuit when the high linearity switch arm is in on-state is less than or equal to the ratio of system characteristic impedance to the impedance at the input port of on high linearity arm at harmonic frequencies.

In one arrangement, a duplexer is provided. Advantageously, the duplexer contributes to the source impedance. In one arrangement, the impedance of the duplexer is frequency dependent. In an example, the duplexer has a first impedance value within a transmittting frequency range associated with the RF switch.

In a further example, the duplexer has a second impedance value at out of band frequencies. In one arrangement, the second impedance value is less than the first impedance value. In an example, the impedance of the duplexer is less than the characteristic impedance value at out of band frequencies. Advantageously, the impedance of the duplexer is matched to the characteristic impedance within an in band frequency range In one aspect, the duplexer comprises a transmit input port, a recieve input port and a common port which have associated impedances which are matched to a characteristic impedance at a pass band frequency range.

In another aspect, the duplexer has an associated transmit pass band frequency range of 704-716 MHz. In a further aspect, the duplexer has an associated receive pass band frequency range of 734-746 MHz.

In an exemplary arrangement, the respective switching arms comprise a stack of transistors. In one example, the dimensions of the transistors in the stack of the high linearity switching arm are larger that the transistors in the stack of the other switching arms.

In one aspect, an inductor is provided. Advantageously, the inductor is operably coupled between the duplexer and the RF switch.

In another aspect, the absolute value of sum of reactance of the inductor and reactance at a common port of the duplexer is less than the reactance at the common port of the duplexer.

In a further aspect, the dimensions and stack height for on-state switch arm are set such that distortion level contributed by an on-state switch arm with a characteristic impedance at its RF input port is lower than a system target by factor dependent on ratio of out of band impedance at the RF input port to system characteristic impedance.

The present disclosure also relates to n RF circuit fabricated thereon, wherein the RF circuit comprises: a plurality of switching arms associated with corresponding RF input ports; the switching arms being controllable to be selectively activated; and a switch source impedance associated with each of the RF input ports; the switch source impedance being frequency dependent such that its value is matched to a characteristic impedance value within a first frequency range; and the value of the switch source impedance is not matched to the characteristic impedance value within a second frequency range; wherein when an RF signal within the first frequency range is transmitted through the RF circuit, between one of the RF input ports and an a common port, an RF distortion voltage within a distortion frequency range results at the common port; and the amplitude of a resultant RF distortion voltage is lower than the RF distortion voltage if the switch source impedance is matched to the characteristic impedance within the second frequency range.

Additionally, the present disclosure relates to a method of fabricating an RF circuit, the method comprising: providing a plurality of switching arms associated with corresponding RF input ports; the switching arms being controllable to be selectively activated; and providing a switch source impedance associated with each of the RF input ports; the switch source impedance being frequency dependent such that its value is matched to a characteristic impedance value within a first frequency range; and the value of the switch source impedance is not matched to the characteristic impedance value within a second frequency range; wherein when an RF signal within the first frequency range is transmitted through the RF circuit, between one of the RF input ports and an a common port, an RF distortion voltage within a distortion frequency range results at the common port; and the amplitude of a resultant RF distortion voltage is lower than the RF distortion voltage if the switch source impedance is matched to the characteristic impedance within the second frequency range.

These and other features will be better understood with reference to the followings Figures which are provided to assist in an understanding of the present teaching.

BRIEF DESCRIPTION OF THE DRAWINGS

The present teaching will now be described with reference to the accompanying drawings in which.

DETAILED DESCRIPTION OF THE DRAWINGS

The present teaching will now be described with reference to some exemplary RF switching systems. It will be understood that the exemplary RF switching systems are provided to assist in an understanding of the present teaching and are not to be construed as limiting in any fashion. Furthermore, circuit elements or components that are described with reference to any one Figure may be interchanged with those of other Figures or other equivalent circuit elements without departing from the spirit of the present teaching.

Figure 1:
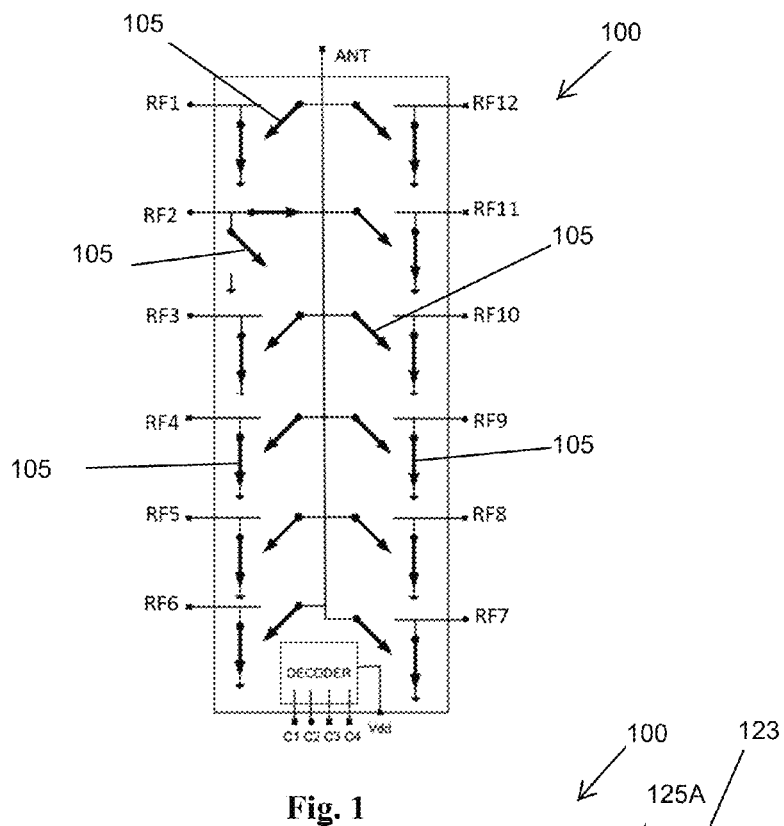
FIG. 1 is a circuit diagram of an exemplary RF switch.
Figure 2:
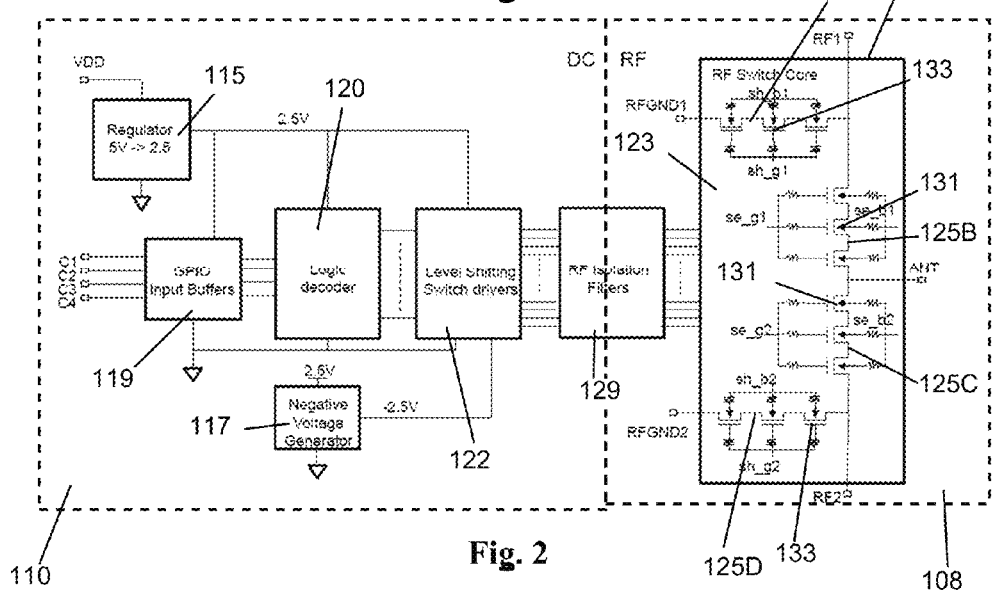
FIG. 2 is a block diagram of an exemplary RF switch.

In advance of describing a radio frequency (RF) switch in accordance with the present teaching an exemplary RF switch 100 is first described with reference to FIGS. 1 to 9. The circuit elements described with reference to the RF switch 100 provide the basic circuit blocks of a traditional RF switch. The RF switch 100 comprises a plurality of switching elements 105 which are operably configured to control the flow of RF power signals between circuit nodes. The RF switch 100 includes two domains; namely, an RF domain section 108 and a direct current (DC) domain section 110 as illustrated in FIG. 2. The DC domain section 110 may comprise one or more digital logic, bias generation, filter, memory, interface, driver and power management circuitry. In the exemplary RF switch 100 the DC domain consists of 5V to 2.5V regulator 115, a negative voltage generator 117, input buffers 119, logic decoder 120 and level-shifting switch drivers 122. These circuits are operably configured to generate the required bias levels, provide power management support and control selection of active switch path through which RF power flows depending on the values set on the control pins C1-C4. Such RF switches are well known in the art.

Figure 3:
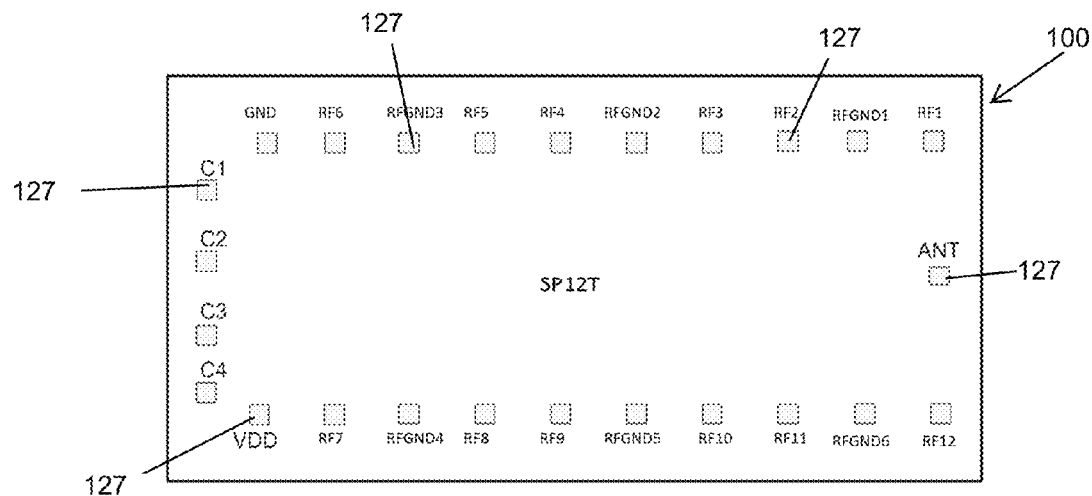
FIG. 3 is pin out diagram of an exemplary RF switch.

The RF domain section 108 comprises a switch core 123 which in the exemplary arrangement includes two series-shunt switch elements 125A-125D. A plurality of transistors 131, 133 are stacked in the switch elements 125A-125D to divide the RF voltage evenly across the transistors so that the voltage between any two terminals of the individual transistors during operation do not exceed a level that may cause performance degradation or damage to the device. RF isolation filters 129 are placed on signal lines controlling the switch gate and body terminals of the transistors 131,133 at the boundary between the RF domain section 108 and the DC domain section 110. In the exemplary arrangement, the RF switch 100 is provided as single-pole, twelve throw (SP12T) RF switch having input/out pins 127 as illustrated in FIG. 3. A description of the pins 127 is detailed in table 1 below.

TABLE 1

| Pin Name | Description |
| --- | --- |
| RF1 | RF Port |
| RFGND1 | RF Ground reference for shunt transistor connecting to RF1 & RF2 Ports |
| RF2 | RF Port |
| RF3 | RF Port |
| RFGND2 | RF Ground reference for shunt transistor connecting to RF3 & RF4 Ports |

TABLE 1-continued

| Pin Name | Description |
| --- | --- |
| RF4 | RF Port |
| RF5 | RF Port |
| RFGND3 | RF Ground reference for shunt transistor connecting to RF5 & RF6 |
| RF6 | RF Port |
| GND | Ground reference for DC domain |
| C1 | Control input, C1-C4 decoded to select which of RF1-RF12 to ANT paths is active |
| C2 | Control input, C1-C4 decoded to select which of RF1-RF12 to ANT paths is active |
| C3 | Control input, C1-C4 decoded to select which of RF1-RF12 to ANT paths is active |
| C4 | Control input, C1-C4 decoded to select which of RF1-RF12 to ANT paths is active |
| VDD | Supply Voltage for DC domain |
| RF7 | RF Port |
| RFGND4 | RF Ground reference for shunt transistor connecting to RF7 & RF8 |
| RF8 | RF Port |
| RF9 | RF Port |
| RFGND5 | RF Ground reference for shunt transistor connecting to RF9 & RF10 |
| RF10 | RF Port |
| RF11 | RF Port |
| RFGND6 | RF Ground reference for shunt transistor connecting to RF11 & RF12 |
| RF12 | RF Port |
| ANT | Antenna Port, RF Common Port |

Figure 4:
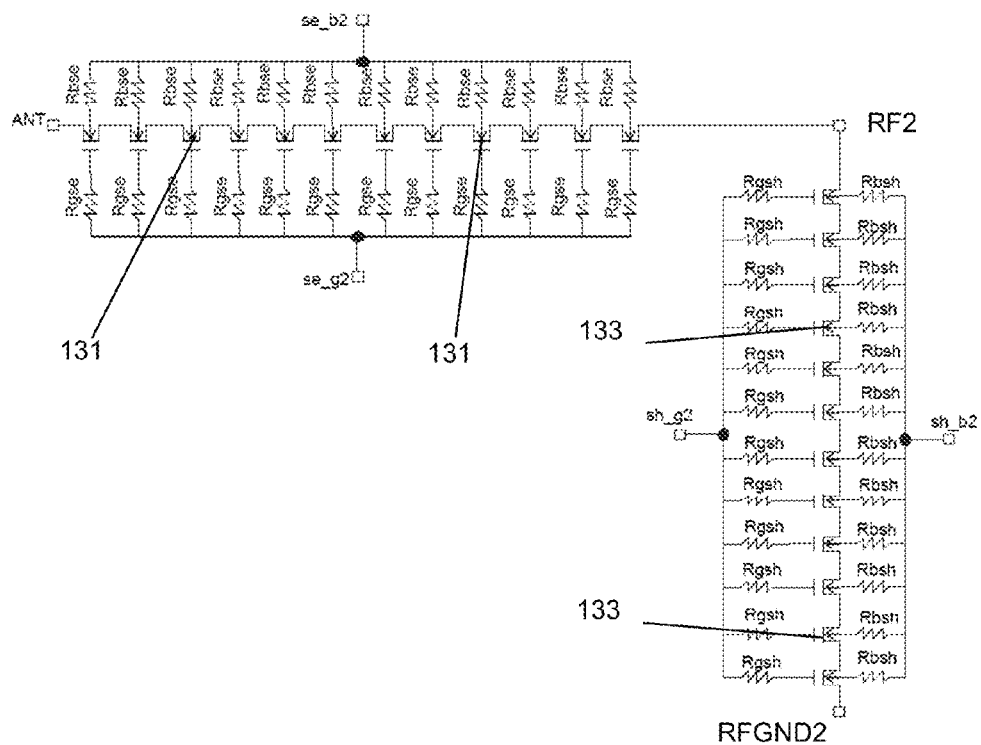
FIG. 4 is a schematic circuit diagram of a detail of the RF switch of FIG. 2.

FIG. 4 shows more detail of the switch core 123 of FIG. 2. The switch core 123 includes a plurality of series transistor elements 131 and a plurality of shunt transistor elements 133. The series transistor elements 131 are in a stacked configuration operably coupled between the antenna node ANT and the RF2 node. The shunt transistor elements 133 are in a stacked configuration operably coupled between the RF2 node and RFGND2 node. The number of transistors in a stack is determined by the maximum RF voltage level that can be experienced on the RF nodes when the switch is operational. A stack of 10-13 transistor devices is common for maximum RF voltages that can be experienced at GSM transmit power levels.

Figure 5:
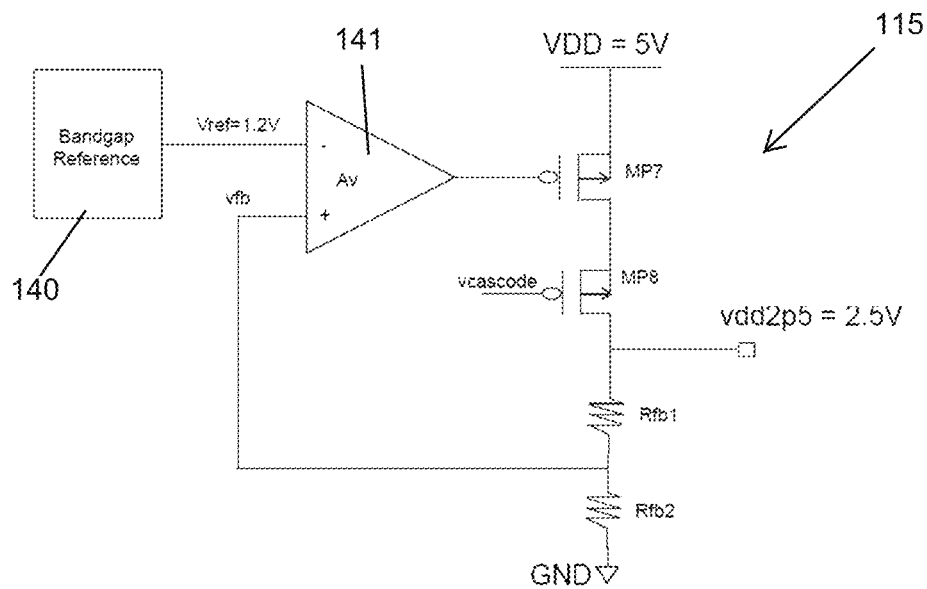
FIG. 5 is a schematic circuit diagram of a detail of the RF switch of FIG. 2.

The voltage regulator 115 of the switch 100 is illustrated in more detail in FIG. 5. The voltage regulator 115 comprises a bandgap reference 140 operably coupled to an input terminal of an op-amp 141. A pair of mosfet transistors MP7, MP8 and a pair of resistors Rfb1, Rfb2 are stacked between a VDD node and a ground reference node. The output from the op-amp 141 drives the MP7 transistor. The gate of the MP8 transistor is operably coupled to a reference voltage source vcascode. A feedback loop is provided from a node intermediate Rfb1 and Rfb2 and an input terminal to the op-amp 141. The voltage regulator 115 is configured to provide a regulated voltage level at a node Vdd2p5. In the exemplary arrange the voltage at the node vdd2p5 is +2.5V.

Figure 6:
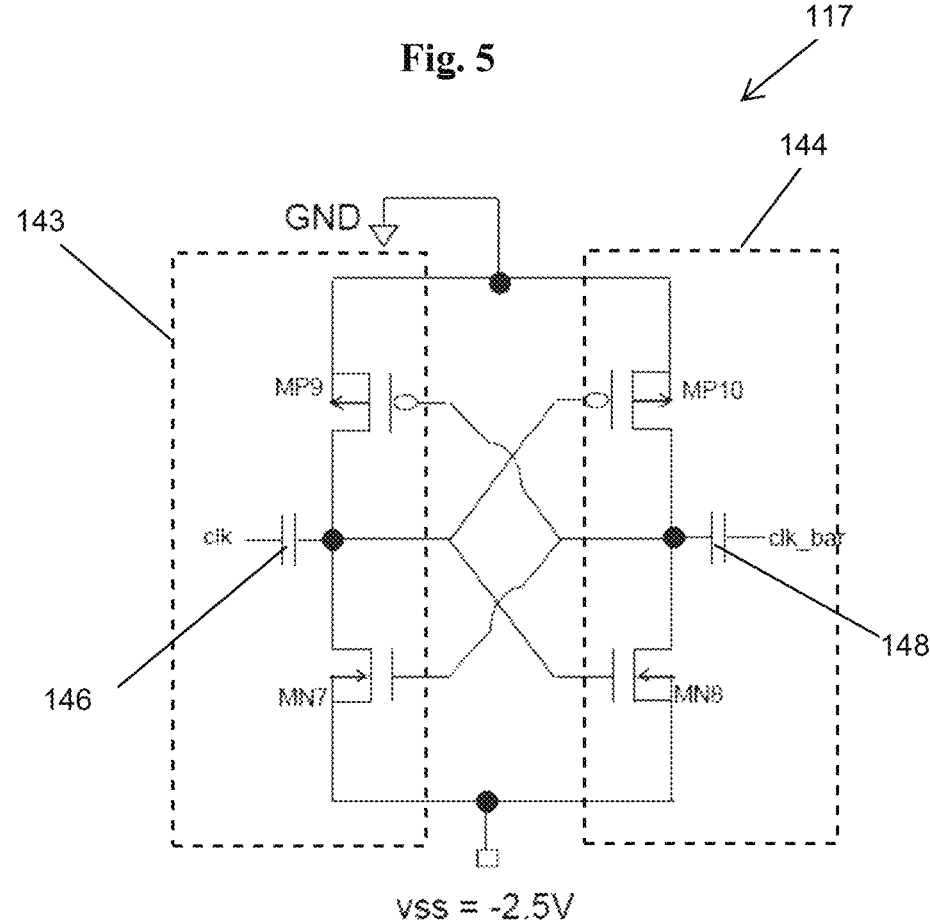
FIG. 6 is a schematic circuit diagram of a detail of the RF switch of FIG. 2.

The negative voltage generator 117 of the switch 100 is illustrated in more detail in FIG. 6. The negative voltage generator 117 comprises a first segment 143 and a second segment 144. The first and second segments 143, 144 are operably coupled between a ground reference node GND and a vss node. The first segment 143 comprises a PMOS transistor MP9 stacked on an NMOS transistor MN7. A first capacitor 146 which receives a clock signal clk is coupled intermediate MP9 and MN7. The second segment 144 comprises a PMOS transistor MP10 stacked on an NMOS transistor MN8. A second capacitor 148 which receives an inverse clock signal clk_bar is coupled intermediate MP10 and MN8. The gates of MP9 and MN7 are driven by the inverse clock signal clk_bar. The gates of MP10 and MN8 are driven by the clock signal clk. The negative voltage generator 117 is configured to provide a negative voltage at the node vss. In the exemplary arrangement the negative voltage which is provided at node vss is −2.5V.

Figure 7:
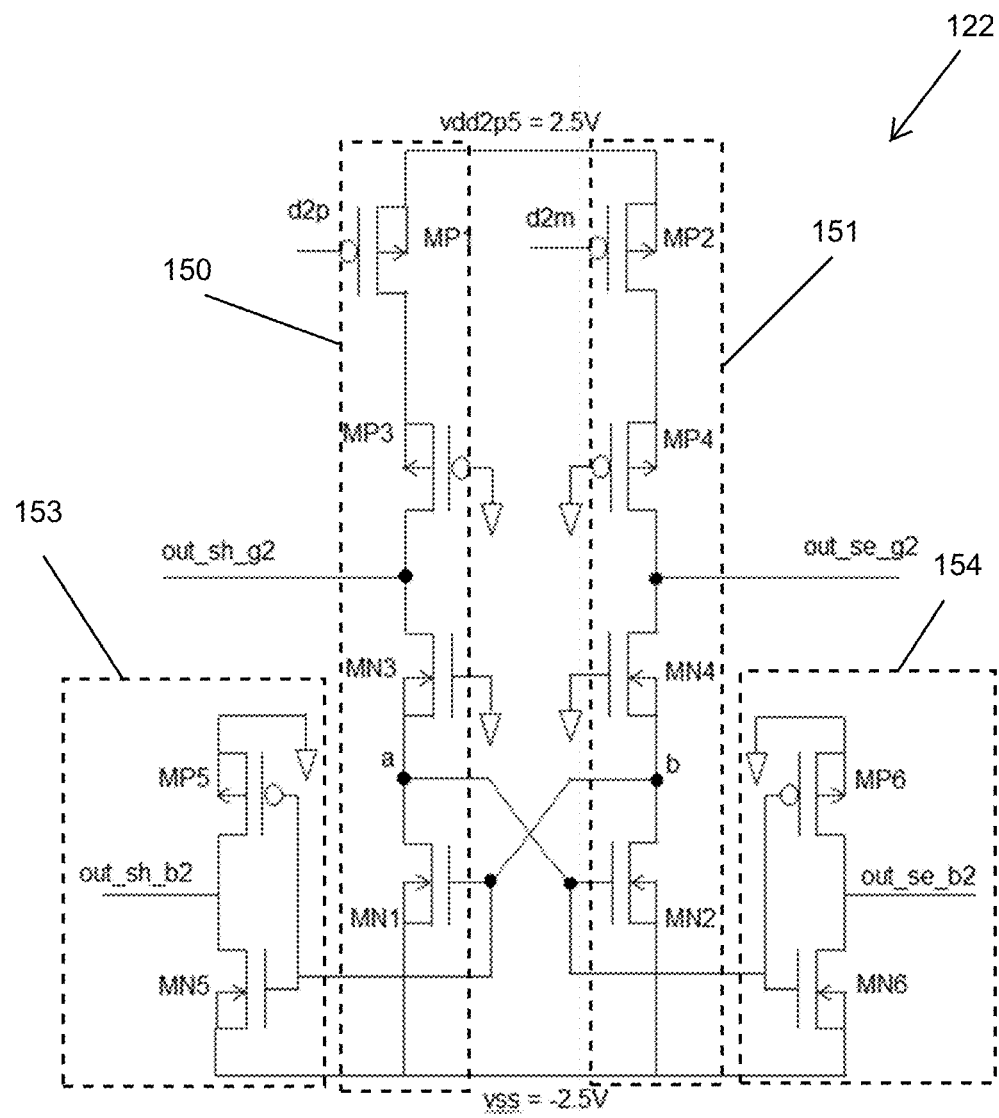
FIG. 7 is a schematic circuit diagram of a detail of the RF switch of FIG. 2.

The level shifting switch driver 122 of the switch 100 is illustrated in more detail in FIG. 7. The switch driver 122 comprises a first switch segment 150 and a second switch segment 151, which are operably coupled between the vdd2p5 node of the 5V-2.5V regulator 115 and the negative voltage node vss of the negative voltage generator 117. In the exemplary arrangement, the first switch segment 150 comprises a pair of PMOS transistors MP1 and MP3 and a pair of NMOS transistors MN3 and MN1. The second switch segment 151 comprises a pair of PMOS transistors MP2 and MP4 and a pair of NMOS transistors MN4 and MN2. The first switch segment 150 is associated with a first CMOS inverter 153 that includes a PMOS transistor MP5 and an NMOS transistor MN5 operably coupled between the vss node and a ground node. The second switch segment 151 is associated with a second CMOS inverter 154 that includes a PMOS transistor MP6 and an NMOS transistor MN6 operably coupled between the vss node and a ground node. The level shifting switch driver 122 is configured to provide four output drive signals which are outputted at nodes out_sh_g2, out_sh_b2, out_se_g2 and out_se_b2. These drive signals are then filtered by the RF isolation filters 129 and the filtered versions of the signals are used to drive the series-shunt switch elements 125A-125D in the switch core 123 of the RF section 108.

Figure 8:
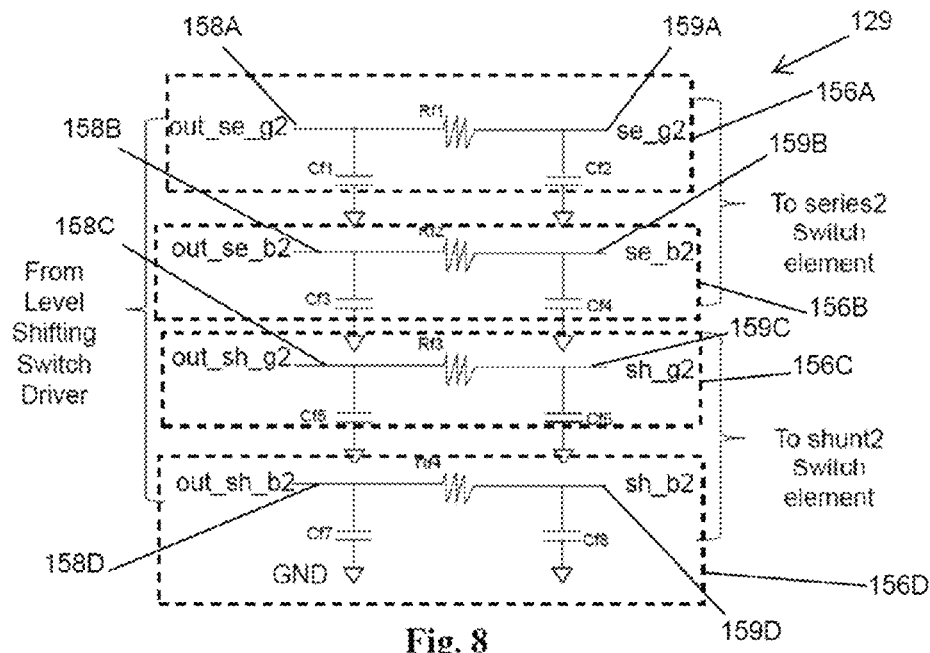
FIG. 8 is a schematic circuit diagram of a detail of the RF switch of FIG. 2.

The RF isolation filters 129 of the switch 100 are illustrated in more detail in FIG. 8. The RF isolation filters 129 are provided in an interface section operably between the DC domain section 110 and the RF domain section 108. In the exemplary arrangement, four filter segments 156A-156D are provided. For brevity, only the filter segment 156A is described. However, it will be appreciated by those of ordinary skill in the art that each of the filter segments 156B to 156D operates in a similar fashion to the filter segment 156A. The filter segment 156A includes a pair of capacitors Cf1 and Cf2 with a resistor Rf1 operably coupled there between. An input node 158A and an output node 159A are provided at respective opposite ends of the resistor Rf1. The capacitors Cf1 and Cf2 each have a first terminal coupled to a ground node. The second terminal of the capacitor Cf1 is coupled to the input node 158A, and the second terminal of the capacitor Cf2 is coupled the output node 159A. The input node 158A receives a drive signal from the node out_se_g2 of the level shifting switch drivers 122 and the output node 159 provides a filtered signal from the node se_g2 which drives the gate terminals of the series switch element 125C in the RF switch core 123 of FIG. 2. Thus the signal from node se_g2 is a filtered representation of the signal from node out_se_g2. In the exemplary arrangement, the filter segment 156B outputs a filtered signal from the node se_b2 which is derived from the signal from node out_se_b2. The filtered signal from the node se_b2 is used to drive the body terminals of the series switch element 125C in the RF switch core 123. The filter segment 156C outputs a filtered signal from node sh_g2 that is derived from the signal of node out_sh_g2. The filtered signal from the node sh_g2 drives the gate terminals of the shunt switch element 125D in the RF switch core 123. The filter segment 156D outputs a filtered signal from the node sh_b2 which is derived from the signal of node out_sh_b2. The filtered signal from the node sh_b2 drives the body terminals of the shunt switch element 125D in the RF switch core 123.

Figure 9:
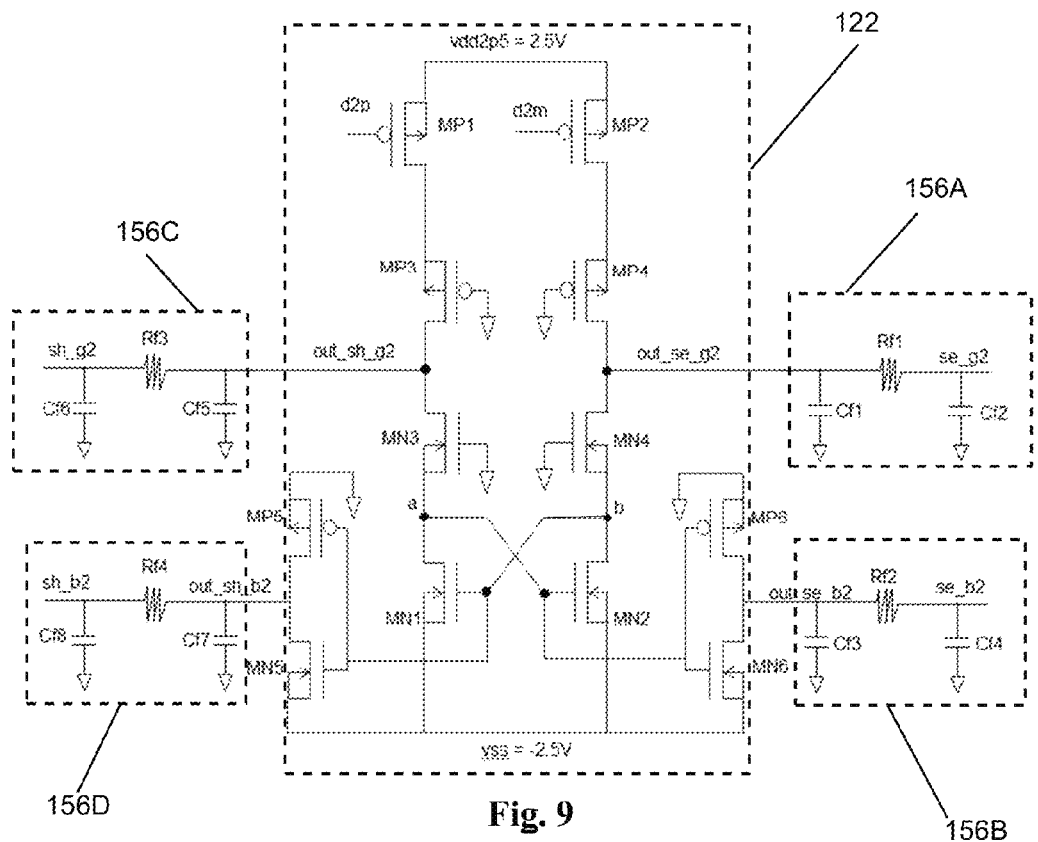
FIG. 9 is a schematic circuit diagram of a detail of the RF switch of FIG. 2.
Figure 10:
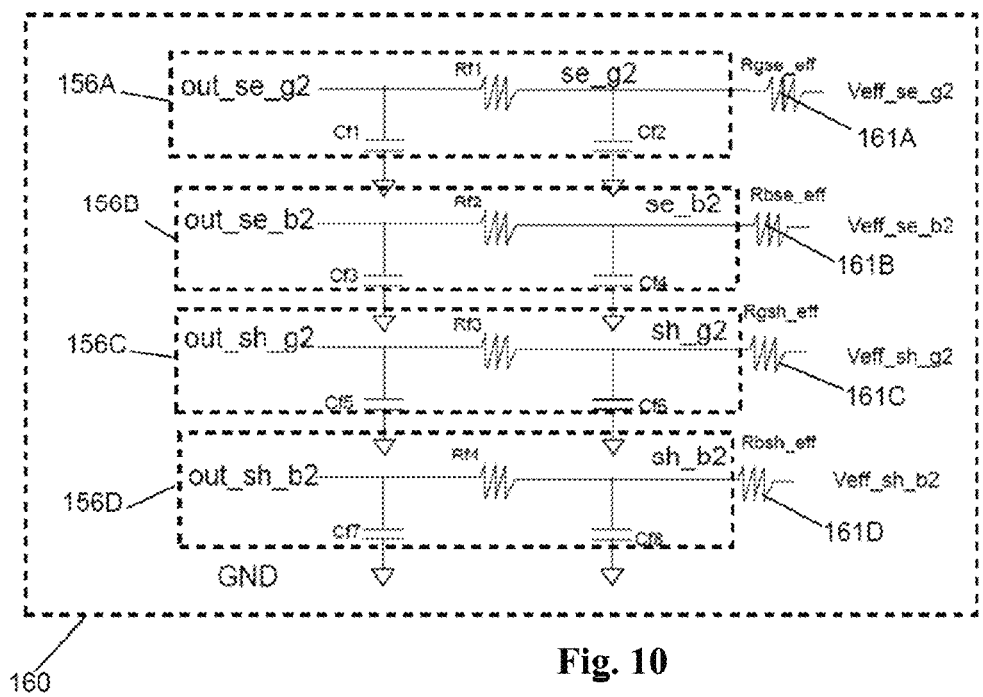
FIG. 10 is an equivalent circuit of the RF isolation filters of FIG. 8.

FIG. 9 illustrates the RF isolation filters 156A-156D operably coupled to the output nodes of the level shifting switch drivers 122. The schematic of FIG. 9 combines the circuit diagrams of FIGS. 7 and 8. An equivalent circuit 160 of the interface between the DC domain section 110 and the RF domain section 108 is illustrated in FIG. 10. The circuit 160 is substantially similar to the circuit of FIG. 8 and like components are indicated by similar reference numerals. An additional resistor element 161 is provided on each filter segment 156 which represents the effective resistance connecting to the gate and body terminals of the transistor elements 131, 133 in the RF switch core 123 of FIG. 2.

Figure 11:
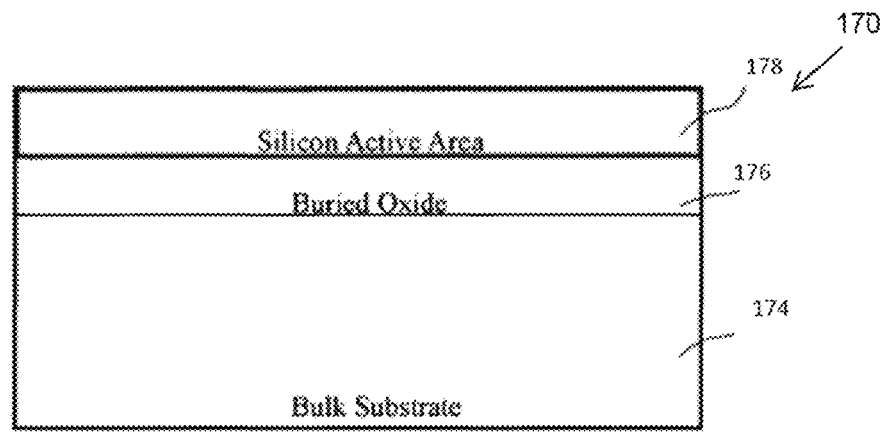
FIG. 11 is a cross sectional side view of a silicon-on-insulator structure on which the RF switch of FIG. 2 may be fabricated thereon.

Referring now to FIG. 11 which illustrates a typical silicon-on-insulator (SOI) structure 170 on which the RF switch 100 may be fabricated thereon. In the exemplary arrangement, an insulating layer sits on top of a silicon substrate. A typical material for the insulating layer is silicon dioxide. In general SOI technologies consist of a bulk substrate 174, a buried oxide layer 176 and a thin active silicon layer 178. The bulk substrate 174 is generally a high resistivity substrate. The bulk substrate 174 can be either P-type or N-Type. A typical thickness for the bulk substrate is 250 μm. The buried oxide layer 176 is an insulator layer, typically silicon dioxide. A typical thickness of the buried oxide layer 176 is 1 μm. The active silicon layer 178 above the buried oxide layer 176 is typically of the order of 0.2 μm. The RF switch 100 may be fabricated in the silicon active area 178 using semiconductor processing techniques that are well known in the art and may include for example, but not limited to, deposition, implantation, diffusion, patterning, doping, and etching. The RF domain section 108 and the DC domain section 110 of the RF switch 100 are typically fabricated on a single semiconductor structure.

The following terms would be understood by those of ordinary skill in the art.

Characteristic Impedance: Value of impedance, typically 50Ω, that all elements and transmission media within RF system are required to present to system or be presented to by system within their operational frequency range. Lowest loss results when impedance presented to and by elements within RF system are matched to system characteristic impedance.

Matched: Ideal match occurs when impedance of elements and transmission media are exactly equal to 50Ω so that no reflection occurs. Quality of match is characterised by Voltage Standing Wave Ratio (VSWR) where VSWR of 1:1 indicates ideal match. In a reality system it will not be ideally matched, in context of this description the term "matched" can be understood to cover non-ideal matching where the voltage standing wave ratio (VSWR) <1.5:1.

Switch Source Impedance: Impedance seen from input port of RF switch, i.e. ratio of voltage at input port of RF switch to current flowing away from input port of RF switch when current flowing into input port of RF switch is zero.

Distortion: Non-linear impedance within devices results in distortion currents flowing when RF voltage is applied to device. Harmonic distortion results when applied RF voltage is single tone (f1) and frequency of distortion currents occur at harmonics, i.e. integer multiples of frequency of applied single tone RF voltage, fdist=(n×f1). Intermodulation distortion results when two RF voltage tones (f1, f2) are applied. Frequency of distortion currents occur at sum or difference of integer multiples of applied tones, i.e. fdist=(n×f1)+/−(m×f2).

Figure 12:
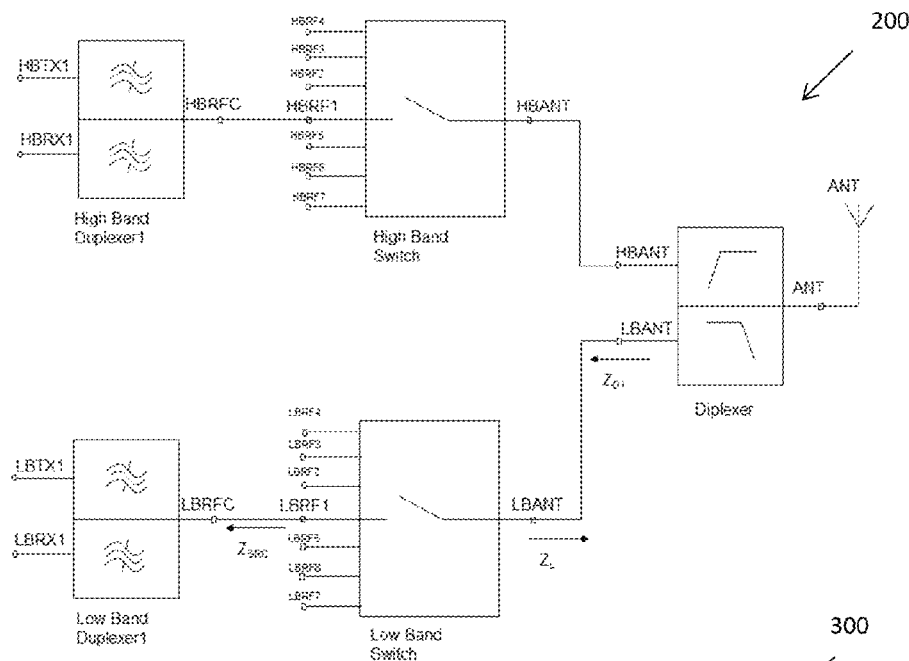
FIG. 12 is a block diagram of an RF switch circuit in accordance with the present teaching.

Referring now to FIGS. 12 there is provided a single antenna feed RF switching system RF 200 in accordance with the present teaching. The RF switching system 200 comprises a high band duplexer operably coupled to a high band switch and a low band duplexer operably coupled to a low band switch. The high band switch and the low band switch is coupled to the dipexer. The duplexer provides a frequency selective transmission path between its common port connected to ANT and its Low Band and High Band ports connected to LBANT and HBANT respectively. The function of the Low Band Switch is to direct RF signal between one of its input ports, LBRF1-LBRF7, to common output port, LBANT. The path between LBANT and LBRF1 supports duplex operation. LBRF1 port on the Low Band Switch is connected to common port, LBRFC, on Low Band Duplexer. The Low Band Duplexer provides frequency selective transmission path from LBRFC to LBTX1 and LBRX1. The low band switch input ports LBRF2-LBRF7 may similarly be connected to other components such as duplexers to allow transmit and receive of frequencies in other bands.

The function of the High Band Switch is to direct RF signal between one of its input ports, HBRF1-HBRF7, to common output port, HBANT. The path between HBANT and HBRF1 supports duplex operation. HBRF1 port on the High Band Switch is connected to common port, HBRFC, on High Band Duplexer. The High Band Duplexer provides frequency selective transmission path from HBRFC to HBTX1 and HBRX1. The high band switch input ports HBRF2-HBRF7 may similarly be connected to other components such as duplexers to allow transmit and receive of frequencies in other bands.

Figure 13:
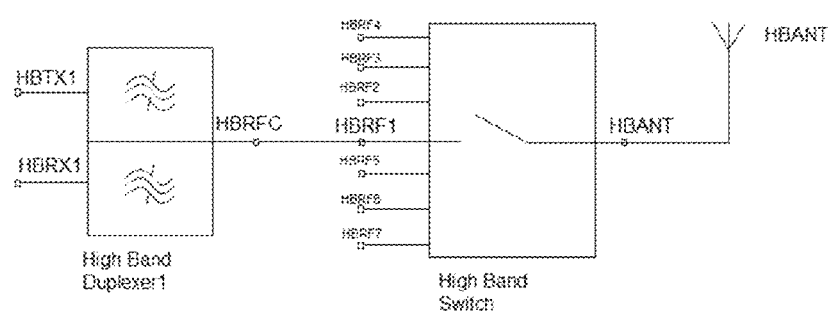
FIG. 13 is a block diagram of an RF switch circuit in accordance with the present teaching.
Figure 13:
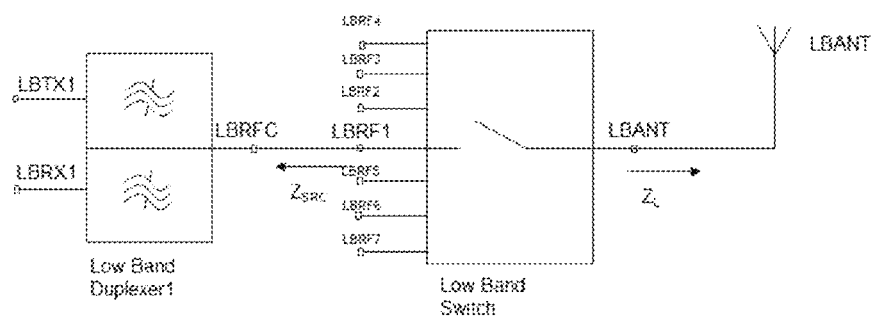

Referring now to FIGS. 13 there is provided a dual antenna feed RF switching system 300 in accordance with the present teaching. The system 300 includes duplexers and switches. In the system 300 there is a dedicated antenna to transmit and receive signals in a high band frequency range, HBANT and a dedicated antenna to transmit and receive signals in a low band frequency range, LBANT. The function of the Low Band Switch is to direct RF signal between one of its input ports, LBRF1-LBRF7, to common output port, LBANT. The path between LBANT and LBRF1 supports duplex operation. LBRF1 port on the Low Band Switch is connected to common port, LBRFC, on Low Band Duplexer. The Low Band Duplexer provides frequency selective transmission path from LBRFC to LBTX1 and LBRX1. The low band switch input ports LBRF2-LBRF7 may similarly be connected to other components such as duplexers to allow transmit and receive of frequencies in other bands.

The function of the High Band Switch is to direct RF signal between one of its input ports, HBRF1-HBRF7, to common output port, HBANT. The path between HBANT and HBRF1 supports duplex operation. HBRF1 port on the High Band Switch is connected to common port, HBRFC, on High Band Duplexer. The High Band Duplexer provides frequency selective transmission path from HBRFC to HBTX1 and HBRX1. The high band switch input ports HBRF2-HBRF7 may similarly be connected to other components such as duplexers to allow transmit and receive of frequencies in other bands.

Figure 14:
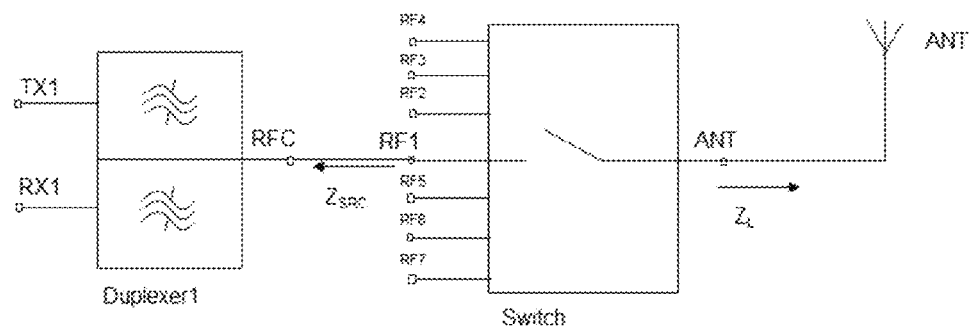
FIG. 14 is a block diagram of an RF switch circuit in accordance with the present teaching.

FIG. 14 shows arrangement of components including duplexer and switch on a single antenna feed RF switching system. In this case there is a single antenna to transmit and receive signals in all frequency bands, ANT. The function of the Switch is to direct RF signal between one of its input ports, RF1-RF7, to common output port, ANT. The path between ANT and RF1 supports duplex operation. RF1 port on the Low Band Switch is connected to common port, RFC, on Duplexer. The Low Band provides frequency selective transmission path from RFC to TX1 and RX1. The switch input ports RF2-RF7 may similarly be connected to other components such as duplexers to allow transmit and receive of frequencies in other bands.

Figure 15A:
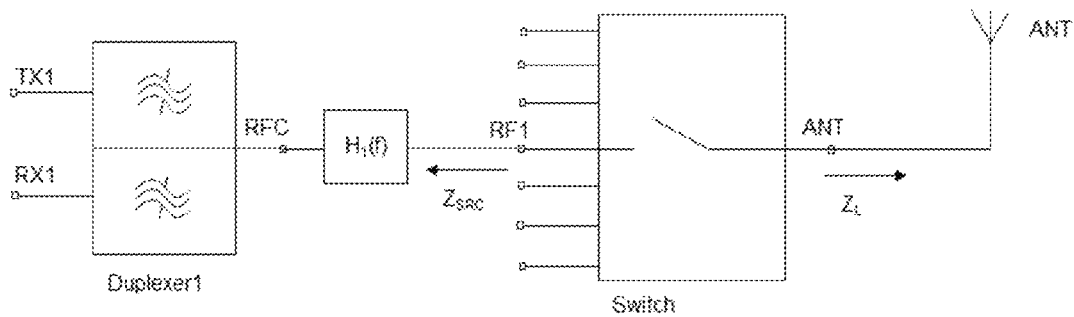
FIGS. 15A and 15B are block diagrams of an RF switch circuit in accordance with the present teaching.

FIG. 15A shows arrangement of components including duplexer and switch on a single antenna feed RF switching system where an additional element with frequency dependent transfer function, $H_1(f)$, is positioned between the duplexer common port, RFC, and switch input port, RF1. Input and output impedances of $H_1(f)$ are frequency dependent.

Figure 15B:
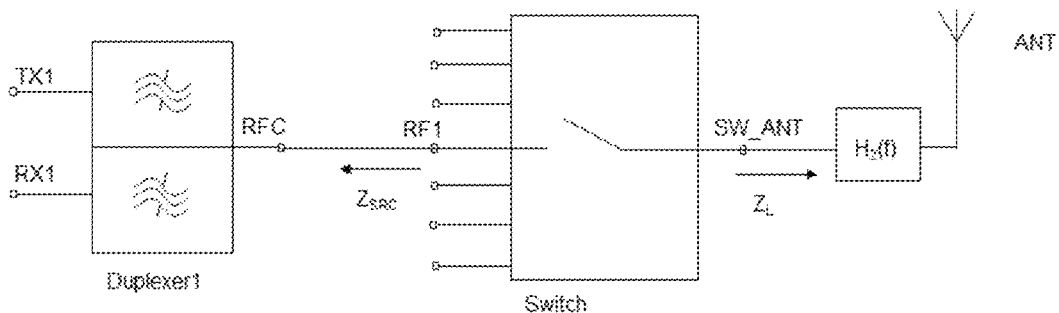

FIG. 15B shows arrangement of components including duplexer and switch on a single antenna feed RF switching system where additional element with frequency dependent transfer function, $H_2(f)$, is positioned between the switch common port, SW_ANT, and antenna, ANT. Input and output impedances of $H_2(f)$ are frequency dependent.

Figure 16:
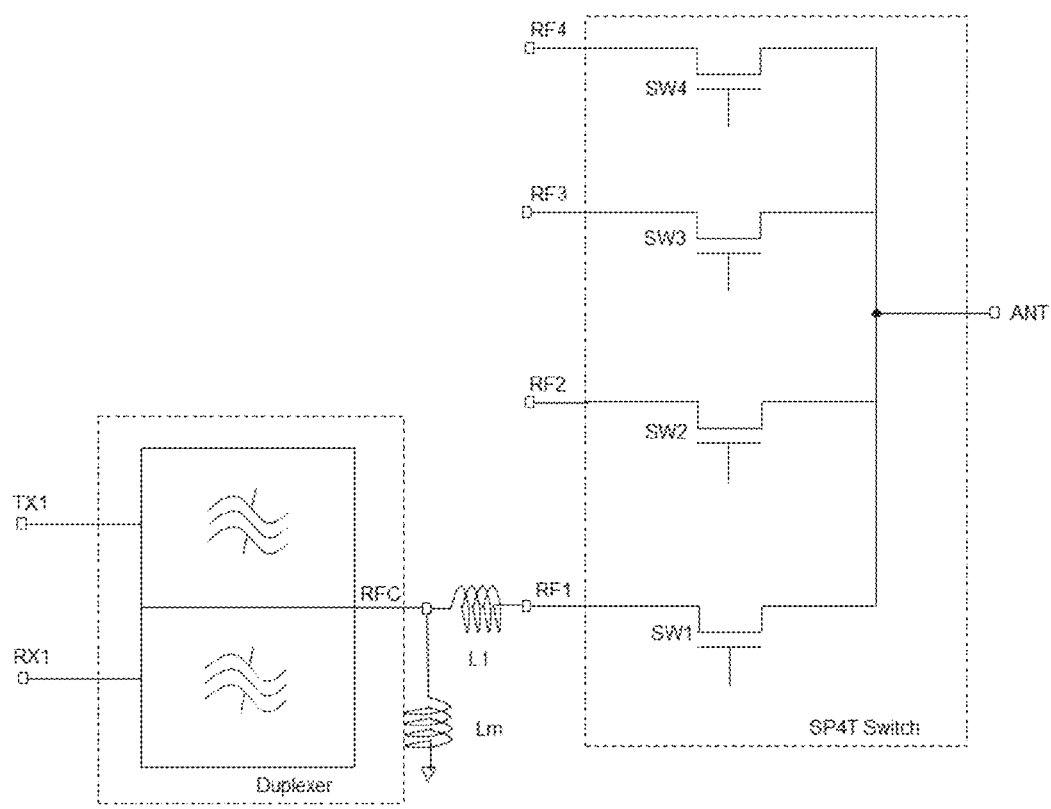
FIG. 16 is a schematic circuit diagram of an RF switch circuit in accordance with the present teaching.

FIG. 16 shows example circuit implementation of FIG. 15(a) with an additional inductor, L1, positioned between the duplexer common port, RFC, and the RF1 port of a SP4T switch. This inductor is included to provide optimum source impedance at switch input at a harmonic frequency without interfering with characteristic 50Ω at the fundamental. Low insertion loss through the duplexer and switch requires good match to characteristic 50Ω impedance within the duplexer pass range.

Figure 17:
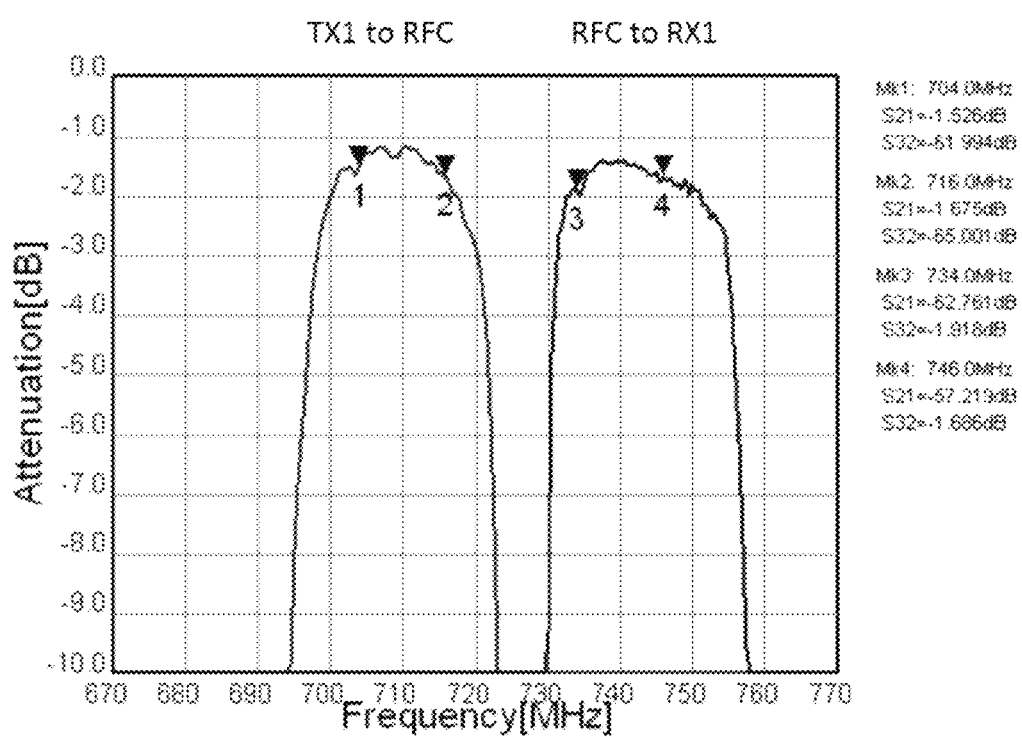
FIG. 17 is a simulated graph of frequency versus attentuation for an RF switch circuit in accordance with the present teaching.

FIG. 17 shows an exemplary frequency response in the two duplexer bands. There is low attenuation in 704-716 MHz range on TX1 to RFC path allowing transmit signal within this range to pass from TX1 to RFC port. There is low attenuation in 734-746 MHz range allowing receive signal within this range to pass from RFC to RX1.

Figure 18:
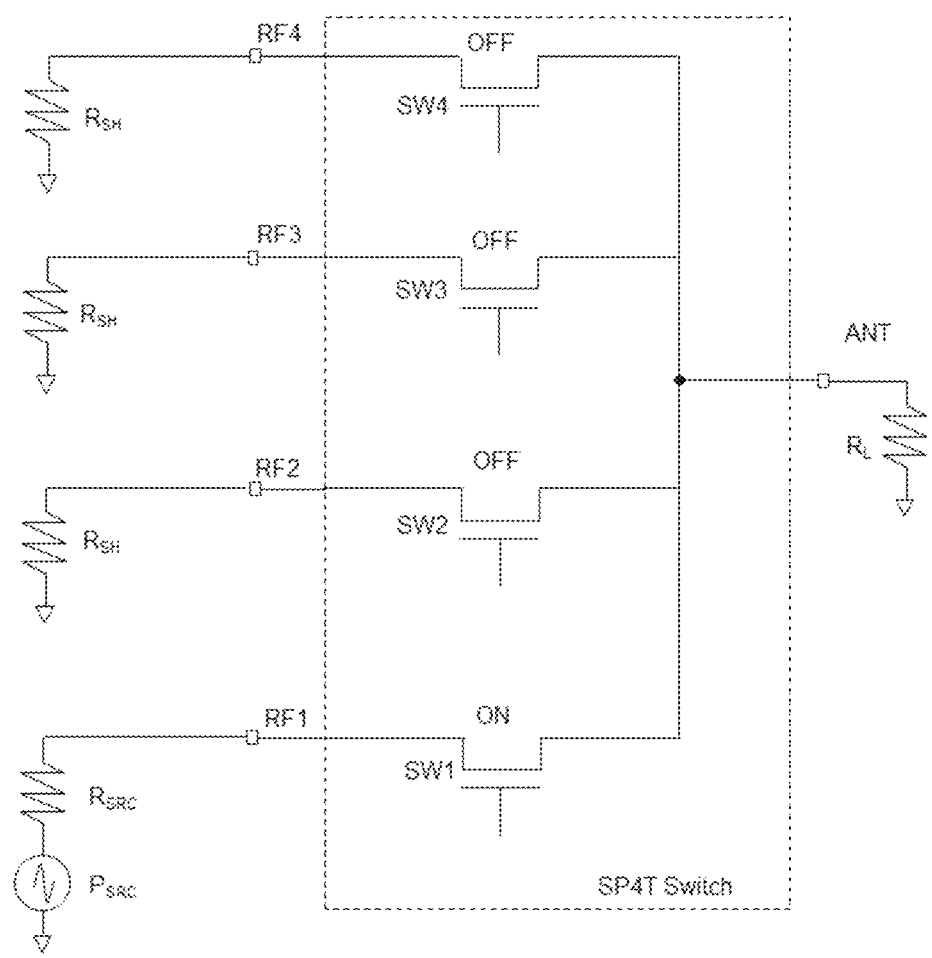
FIG. 18 is a schematic circuit diagram of an RF switch circuit in accordance with the present teaching.

FIG. 18 shows a simplified arrangement to characterise the SP4T switch. Four transistor switch arms, SW1-SW4, provide paths between RF1-RF4 input ports and common antenna port, ANT. Transistor switch arms SW1-SW4 are stacked transistor configuration. In the example shown, the series path through SW1 from RF1 to ANT is on, allowing RF power from source, $P_{SRC}$, at RF1 to pass to ANT. Series paths through switch arms SW2-SW4 are off. The antenna port, ANT, is terminated in impedance $R_L$. The inactive switch input ports, RF2-RF4, are terminated in impedance $R_{SH}$. The active RF source at RF1 has source impedance, $R_{SRC}$. In switch designed for characteristic impedance of 50Ω, the termination and source impedances, $R_L$, $R_{SH}$ and $R_{SRC}$, are normally equal to the characteristic impedance value of 50Ω.

Figure 19:
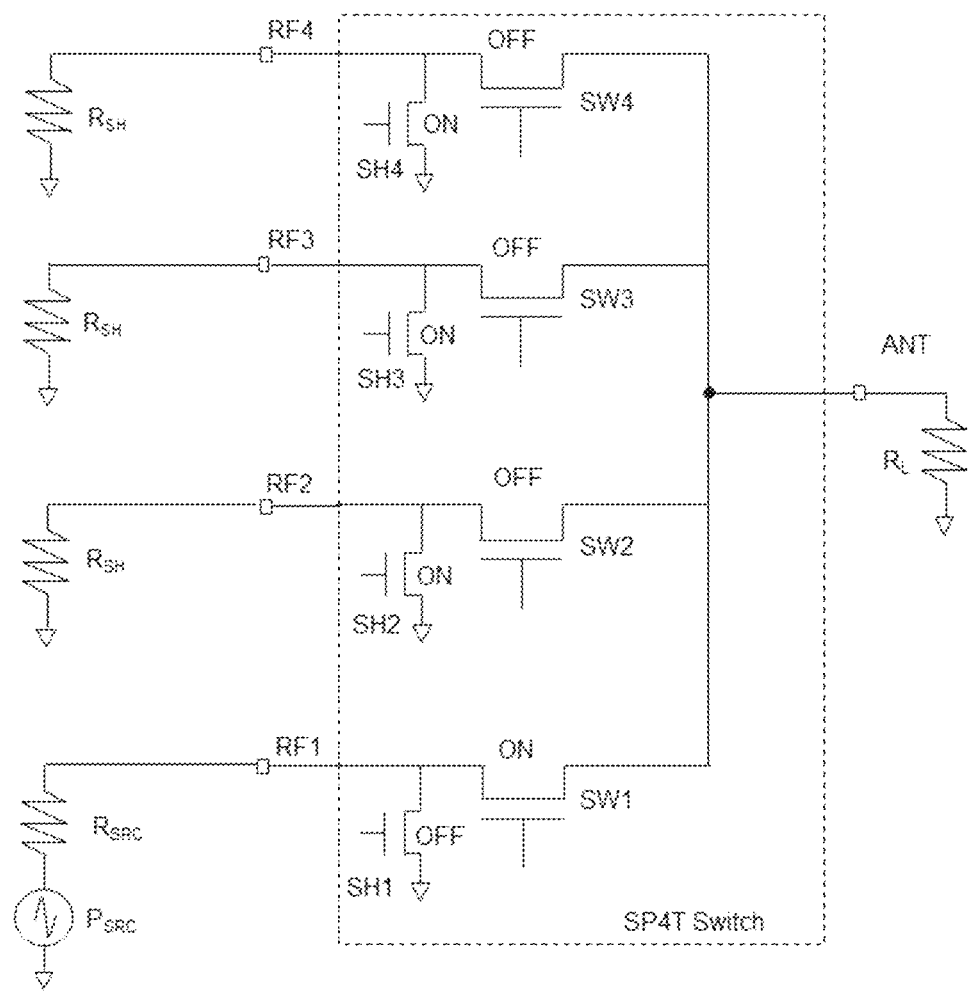
FIG. 19 is a schematic circuit diagram of an RF switch circuit in accordance with the present teaching.

FIG. 19 shows a simplified arrangement to characterise the SP4T switch where there are transistor switch arms, SH1-SH4, arranged in shunt configuration on each of the input ports RF1-RF4. These are included to provide impedance that is lower than the characteristic impedance of 50Ω on an inactive RF switch path to improve isolation.

Figure 20:
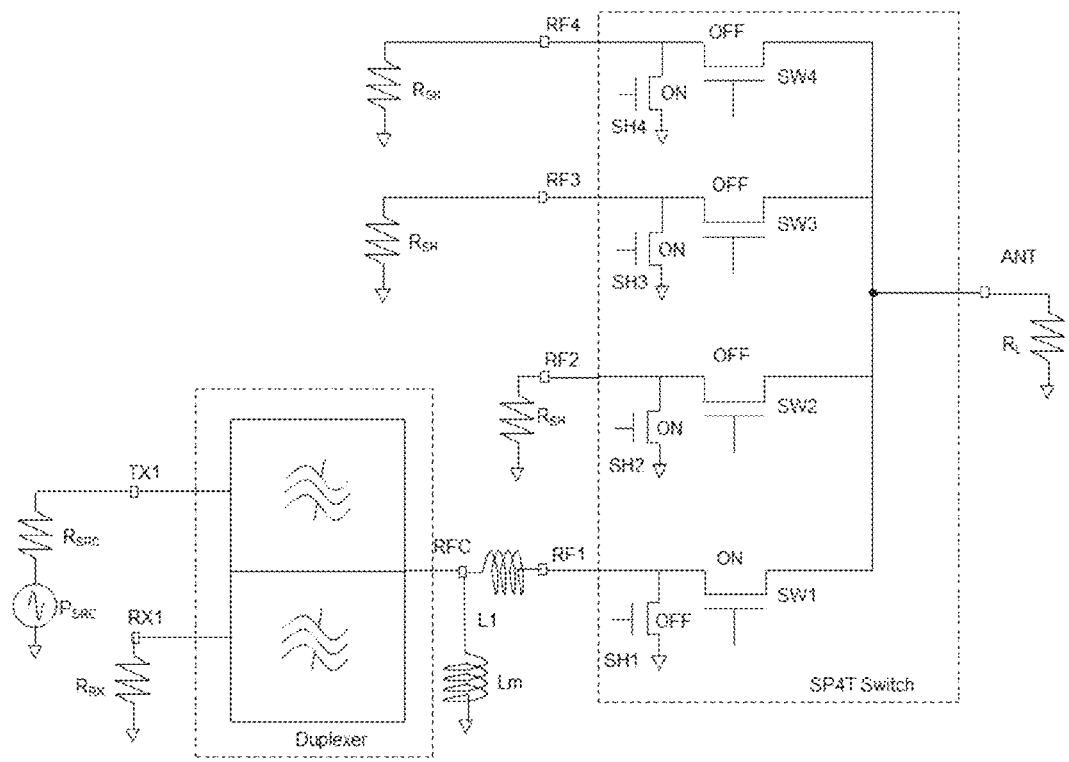
FIG. 20 is a schematic circuit diagram of an RF switch circuit in accordance with the present teaching.

FIG. 20 shows a simplified arrangement to characterise a SP4T cellular module. In example shown, the series path through SW1 from RF1 to ANT is on, allowing RF power from source, $P_{SRC}$, at TX1 port on duplexer to pass to ANT. Inductor, L1, is included between common port of duplexer, RFC, and RF1 input port to switch. This is to provide optimum source impedance at the switch input at a harmonic frequency without interfering with characteristic 50Ω at the fundamental. The RX1 port of the duplexer is terminated in impedance, $R_{RX}$. Series paths through switch arms SW2-SW4 are off. The antenna port, ANT, is terminated in impedance $R_L$. The inactive switch input ports, RF2-RF4, are terminated in impedance $R_{SH}$. The active RF source at RF1 has source impedance, $R_{SRC}$. In switch designed for characteristic impedance of 50Ω, the termination and source impedances, $R_L$, $R_{SH}$ $R_{RX}$ and $R_{SRC}$, are normally equal to the characteristic impedance value of 50Ω. The purpose of inductor, Lm, is to provide impedance match on the duplexer common port, RFC. This reduces the in-band insertion loss through the duplexer.

Distortion arises due to non-linear impedances within transistors themselves and within stacked transistor arrangement. Impedance of non-linear element is a function of the voltage difference across the element. The resulting current can be expressed as a power series of the form:

$$i = a_0 + a_1 \cdot v + a_2 \cdot v^2 + a_3 \cdot v^3 + \quad \text{Equation 1}$$

Where:
i is current flowing through non-linear impedance,
v is voltage difference across non-linear impedance element; and
$a_n = \{a_0, a_1, a_2, a_3, \ldots\}$ are $n^{th}$ order conductance coefficients.

For the case where voltage difference, v, is a single tone of amplitude $v_x$, at frequency f, i.e.

$$v = v_x \cdot \cos(2\pi f t) \quad \text{Equation 2}$$

The $a_n$ terms result in $n^{th}$ components in output current at multiples of n-times the fundamental frequency. Circuit analysis leads to model for harmonic distortion of transistor stack as RF voltage source at harmonic frequency with amplitude, $V_{dist}$, in series with linear impedance, $Z_{dist}$. The amplitude of distortion as a function of order is given by $$v_{dist}(n) = N_{stack} \cdot \frac{a_n}{a_1} v_x^n \quad \text{Equation 3}$$

Where:
$v_{dist}$ is amplitude of $n^{th}$ order distortion voltage of transistor stack,
$a_n$ is $n^{th}$ order conduction coefficient of transistor in stack,
$a_1$ is $1^{st}$ order conduction coefficient, inverse of linear impedance of transistor in stack,
$v_x$ is fundamental voltage amplitude across one transistor in stack,
$N_{stack}$ is number of transistors in stack, and
n=2, 3, 4, . . . , is index representing order of the distortion.
The distortion source impedance is given by:

$$Z_{dist} = N_{stack} \cdot \frac{1}{a_1} \quad \text{Equation 4}$$

Where:
$Z_{dist}$ is impedance of transistor stack distortion voltage source; and
$a_1$ is $1^{st}$ order conduction coefficient, inverse of linear impedance of transistor in stack.

Conduction coefficients in Equations 3 and 4 are dependent both on electrical parameters of a given process technology and whether transistors in switch arm are in an on-state or off-state. For the case where switch arm is implemented on CMOS process with NMOS transistors operating in linear region $1^{st}$ order conduction coefficient for transistor in on-state is approximated from linear region MOSFET I-V expression as $$a_1 = \mu_n C_{ox}\left(\frac{W}{L}\right)(V_{gs} - V_t) \quad \text{Equation 5}$$

Where:
$a_1$ is $1^{st}$ order conduction coefficient, inverse of linear impedance of on-state transistor in stack,
$\mu_n$ is mobility of majority carriers, electrons,
$C_{ox}$ is gate oxide capacitance per unit area,
W is width of transistor in stack,
L is length of transistor in stack,
$V_{gs}$ is gate to source voltage, and
$V_t$ is NMOS threshold voltage.

Expressions for the higher order conduction coefficients represent the I-V characteristic's deviation from ideal linear behaviour and must be derived with reference to specific process technology parameters.

$$a_n = k_n \cdot a_1, \quad k_n \ll 1 \quad \text{Equation 6}$$

Where:
$a_1$ is $1^{st}$ order conduction coefficient, inverse of linear impedance of on-state transistor in stack,
$a_n$ is $n^{th}$ order conduction coefficient,
$k_n$ is process technology dependent ratio of $n^{th}$ order conduction coefficient to $1^{st}$ order conduction coefficient; and
n=2, 3, 4, . . . , is index representing order of the distortion.

For the case where switch arm is implemented on CMOS process with NMOS transistors operating in linear region $1^{st}$ order conduction coefficient for transistor in off-state is approximated as $$a_1 = \frac{C_{ox} \cdot W \cdot L}{4} \quad \text{Equation 7}$$

Where:
$a_1$ is $1^{st}$ order conduction coefficient, inverse of linear impedance of off-state transistor in stack,
$C_{ox}$ is gate oxide capacitance per unit area,
W is width of transistor in stack, and
L is length of transistor in stack.

Expressions for the higher order conduction coefficients represent the I-V characteristic's deviation from ideal linear behaviour and must be derived with reference to specific process technology parameters.

Figure 21:
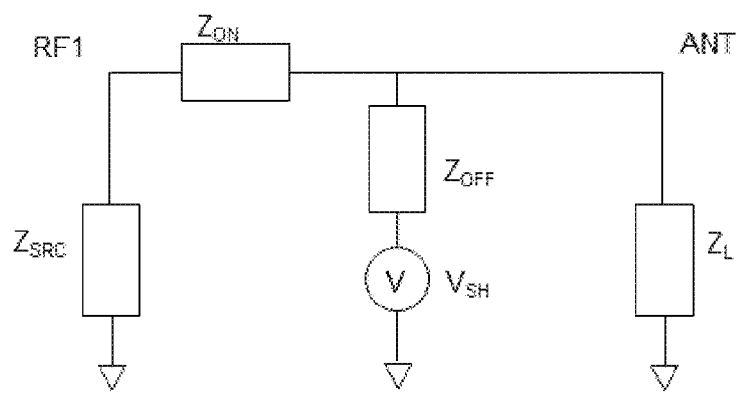
FIG. 21 is a schematic circuit diagram of an RF switch circuit in accordance with the present teaching.

Interaction between harmonic distortion sources within switch and impedances external to the switch is illustrated with reference to FIGS. 21 and 22. FIG. 21 shows a circuit model for harmonic distortion sources due to off-state switch paths, SW2-SW4, of SP4T RF switch of FIGS. 18-20. RF distortion source of amplitude $V_{SH}$, amplitude can be determined with reference to Equation 3. $Z_{OFF}$ represents impedance of off-state switch paths, SW2-SW4, and can be determined with reference to Equation 4. $Z_{ON}$ represents impedance of the on-state switch path through SW1 from RF1 to ANT. Switch input port, RF1, is terminated in impedance $Z_{SRC}$. Antenna port, ANT, is terminated in impedance $Z_L$.

Circuit analysis of FIG. 21 leads to the following transfer function of distortion voltage within off-state switch arms to the load at antenna.

$$v_{sh\_ant} = v_{sh} \cdot \frac{z_L // (z_{SRC} + z_{ON})}{z_{OFF} + z_L // (z_{SRC} + z_{ON})} \qquad \text{Equation 8}$$

Where:
$v_{sh\_ant}$ is the distortion voltage amplitude at ANT due to off-state switch paths,
$v_{sh}$ is the amplitude of off-state switch path distortion voltage,
$Z_{OFF}$ is impedance of off-state switch path,
$Z_{SRC}$ is impedance seen at switch input, RF1,
$Z_L$ is load impedance at antenna, ANT,
$Z_{ON}$ is impedance of on-state switch path, and
$Z_{OFF}$ is impedance of on-state switch path.

Distortion power in load due to the off-state switch paths is given by $$P_{sh} = \frac{(v_{sh\_ant})^2 \cdot \text{Re}\{z_L\}}{z_L^2} \qquad \text{Equation 9}$$

Where:
$P_{sh}$ is the distortion power in load due to off-state switch paths,
$v_{sh\_ant}$ is the distortion voltage amplitude at ANT due to off-state switch paths,
$Z_L$ is load impedance at antenna, ANT; and
$\text{Re}\{Z_L\}$ is real component of load impedance at antenna, ANT.

Figure 22:
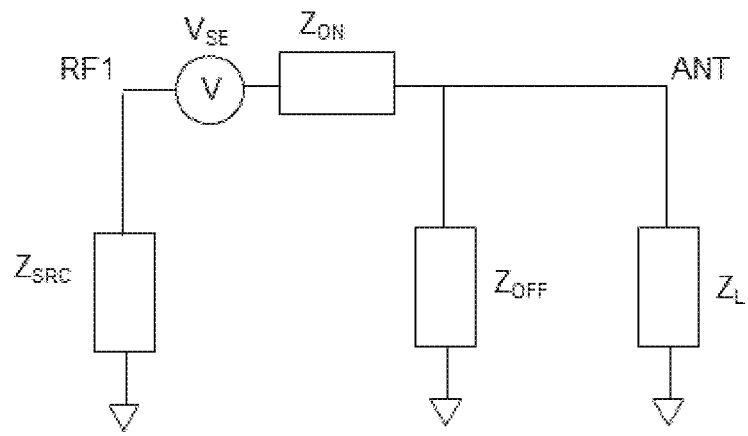
FIG. 22 is a schematic circuit diagram of an RF switch circuit in accordance with the present teaching.

FIG. 22 shows a circuit model for harmonic distortion sources due to on-state switch paths, SW1, of SP4T RF switch of FIGS. 18-20. RF distortion source of amplitude $V_{SE}$, amplitude can be determined with reference to Equation 3. $Z_{ON}$ represents impedance of the on-state switch path through SW1 from RF1 to ANT. Switch input port, RF1, is terminated in impedance $Z_{SRC}$. Antenna port, ANT, is terminated in impedance $Z_L$.

Circuit analysis of FIG. 22 leads to the following transfer function of distortion voltage within on-state switch path to the load at switch antenna port.

$$v_{se\_ant} = v_{se} \cdot \frac{z_L // z_{OFF}}{(z_L // z_{OFF}) + z_{SRC} + z_{ON}} \qquad \text{Equation 10}$$

Where:
$v_{se\_ant}$ is the distortion voltage amplitude at ANT due to on-state switch paths,
$v_{se}$ is the amplitude of on-state switch path distortion voltage,
$Z_{SRC}$ is impedance at switch input port, RF1,
$Z_L$ is impedance at switch antenna port, ANT,
$Z_{ON}$ is impedance of on-state switch path; and
$Z_{OFF}$ is impedance of off-state switch path Distortion power in load due to the on-state switch path is given by $$P_{se} = \frac{(v_{se\_ant})^2 \cdot \text{Re}\{z_L\}}{z_L^2} \qquad \text{Equation 11}$$

Where:
$P_{se}$ is the distortion power in load due to on-state switch paths,
$v_{se\_ant}$ is the distortion voltage amplitude at ANT due to on-state switch paths,
$Z_L$ is load impedance at antenna, ANT; and
$\text{Re}\{Z_L\}$ is real component of load impedance at antenna, ANT.

Total distortion power in load is the sum of distortion power due to the off-state switch and distortion power due to on-state switch path.

$$P_{tot} = P_{sh} + P_{se} \qquad \text{Equation 12}$$

Where:
$P_{tot}$ is the total distortion power in load,
$P_{sh}$ is the distortion power in load due to off-state switch paths; and
$P_{se}$ is the distortion power in load due to on-state switch paths.

Figure 23:
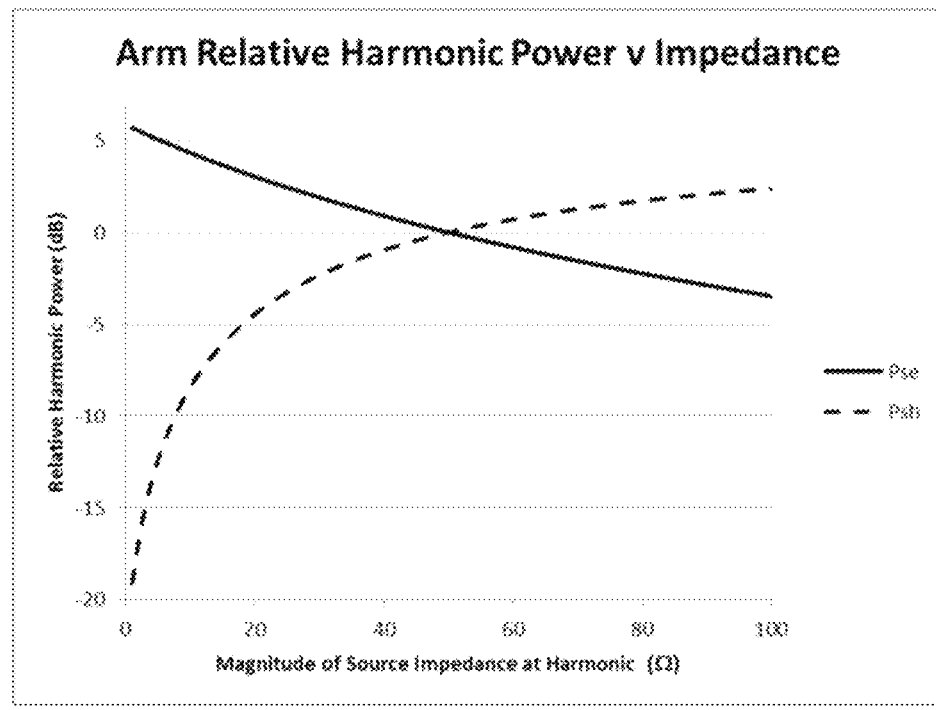
FIG. 23 is a simulated graph of relative harmonic power versus impedance.

FIG. 23 shows how the distortion power in load due to off-state switch paths, $P_{sh}$, and on-state switch paths, $P_{se}$, vary with magnitude of source impedance for case where $Z_{ON}=2\Omega$, $Z_L=50\Omega$. In both cases power is plotted in dB relative to power when $Z_{SRC}=50\Omega$, i.e. 0 dB for both curves occurs at $Z_{SRC}=50$. Power due to the off-state switch paths, $P_{sh}$, decreases as magnitude of source impedance is decreased. Power due to the on-state switch paths, $P_{se}$, increases as magnitude of source impedance is decreased.

Equations 8-12 show how distortion power that results in a load due to distortion sources in transistors in RF Switch can be influenced by impedances external to the RF switch. The impedances at the ports of the RF switch within the switching system vary with frequency. For optimum transmission of RF signal with lowest power loss these impedances are generally required to be matched to system characteristic impedance within the frequency band of the RF signal that is to be transmitted or received. Outside of this frequency band the impedance at the ports of the RF switch are not required to be matched to system characteristic impedance.

Figure 24:
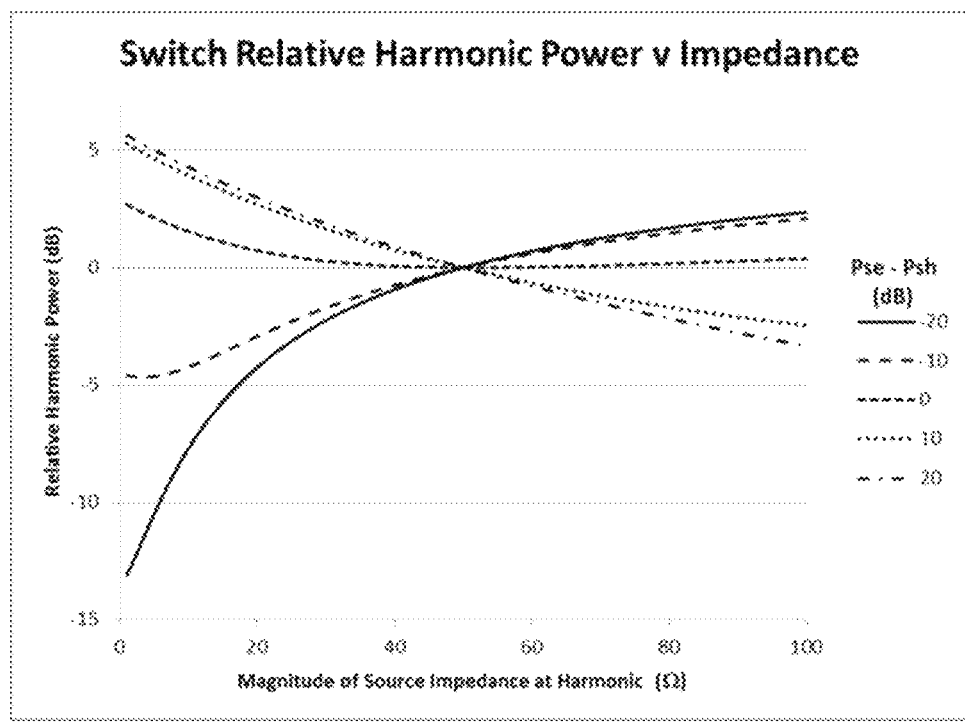
FIG. 24 is a simulated graph of relative harmonic power versus impedance.

It follows from this analysis that an optimum configuration can be designed for RF Switching System taking account of these facts. Whether the out of band impedance that is to be optimised for distortion should be higher or lower than the system characteristic impedance will depend on the origin of distortion within the RF switch. This is illustrated in FIG. 24 where the relative variation of total distortion power in load, $P_{tot}$, due to RF switch is plotted versus the magnitude of source impedance for five different scenarios of distortion within the RF switch. The different curves represent the difference in harmonics power in load due to on-state switch paths relative to the off-state switch paths, i.e. $P_{se}-P_{sh}$.

The absolute value of distortion power in load and relative power due to on-state switch arm compared to off-state switch arms depends on factors such as transistor stack device dimension and stack height. Equations 3-7 can be used to design RF switch so that the resultant distortion power in load due to distortion sources within the RF switch can be greatly reduced by ensuring an appropriate value of out of band impedance at the ports of the RF switch.

Minimising out of band impedance seen by input port of RF Switch in module is necessary to achieve low distortion levels required for LTE for high throw count, low insertion loss RF switch modules.

The source impedance seen by input port, RF1, of the active switch arm, SW1, of the SP7T RF Switch in FIG. 17 is set by the impedance $Z_{dup}$ at the duplexer common port, RFC.

$$Z_{dup} = R_{dup} + j \cdot X_{dup} \qquad \text{Equation 13}$$

Where:
$Z_{dup}$ is impedance at duplexer common port,
$R_{dup}$ is real impedance at duplexer common port, and
$j \cdot X_{dup}$ is imaginary impedance at duplexer common port.

The duplexer impedance is required to be matched to system characteristic impedance, i.e. 50Ω, within the TX and RX pass band to minimise insertion loss and return loss. Outside the TX and RX pass band frequencies duplexer impedance can be mismatched to system characteristic impedance but there is no insertion loss or return loss requirement dictating value of impedance at common port of duplexer at harmonic frequencies of pass band.

In this illustrative example $H_1(f)$ is realised through addition of a single inductor of value L1 between common port of duplexer and input port on active switch path is used to reduce harmonic impedance seen by switch. The source impedance seen by input port, RF1, of the active switch arm, SW1, of the SP7T RF Switch in FIG. 15A, $Z_{SW\_src}$ is given by $$Z_{sw\_src} = R_{dup} + j \cdot X_{dup} + j \cdot X_{L1} \qquad \text{Equation 14}$$

Where:
$Z_{sw\_src}$ is impedance at input port of switch active path,
$R_{dup}$ is real impedance at duplexer common port,
$j \cdot X_{dup}$ is imaginary impedance at duplexer common port and
$j \cdot X_{L1}$ is imaginary impedance of series inductor between duplexer common port and switch input port.

From Equation 14 it is seen that impedance seen by input port of active switch path becomes minimum when imaginary impedance at duplexer common port is cancelled by imaginary impedance of inductor L1, i.e.

$$|Z_{sw\_src}| = R_{dup}, -X_{dup} = X_{L1} \qquad \text{Equation 15}$$

This is achieved if imaginary impedance at duplexer common port is negative. Appropriate value of inductor is chosen to determine frequency at which imaginary impedance seen by switch at input port becomes zero, depending on specific frequency at which it is necessary to minimise distortion.

The absolute distortion power due to on-state switch arms in 50Ω characteristic impedance is designed to be lower than the system target following relationship below at frequency of interest.

$$P_{se\_50} < P_{sys} + 20 \cdot \log_{10}\left[\left(\frac{z_L // z_{OFF}}{(z_L // z_{OFF}) + z_{ON} + z_{sw\_src}}\right) \Big/ \left(\frac{z_L // z_{OFF}}{(z_L // z_{OFF}) + z_{ON} + 50}\right)\right] \qquad \text{Equation 16}$$

Where:
$P_{se\_50}$ is the distortion power in load due to on-state switch paths in dBm,
$P_{sys}$ is the allowable distortion power in dBm,
$Z_{sw\_src}$ is impedance at input port of switch active path,
$Z_L$ is load impedance at antenna, ANT,
$Z_{ON}$ is impedance of on-state switch path, and
$Z_{OFF}$ is impedance of off-state switch paths.

The absolute harmonic power due to on-state switch arms in 50 characteristic impedance is designed to be lower than the system target following relationship below at frequency of interest.

$$P_{sh\_50} < P_{sys} + 20 \cdot \log_{10}\left[\left(\frac{z_{sw\_src} // (z_L + z_{ON})}{z_{OFF} + z_{sw\_src} // (z_L + z_{ON})}\right) \Big/ \left(\frac{50 // (z_L + z_{ON})}{z_{OFF} + 50 // (z_L + z_{ON})}\right)\right] \qquad \text{Equation 17}$$

Where:
$P_{sh\_50}$ is the distortion power in load due to off-state switch paths in dBm,
$P_{sys}$ is the allowable distortion power in dBm,
$Z_{sw\_src}$ is impedance at input port of switch active path,
$Z_L$ is load impedance at antenna, ANT,
$Z_{OFF}$ is impedance of off-state switch path; and
$Z_{ON}$ is impedance of on-state switch paths.

Benefit of implementation of improved linearity RF switching system of FIG. 15 is illustrated in the table below. It is possible to increase throw count of switch to eight, facilitated by design of switch per equations 16 and 17. Values show simulation result of module with target to achieve $3^{rd}$ harmonic power less than −105 dBm in LTE Band 17 with transmission at 710 MHz. Duplexer impedance at $3^{rd}$ harmonic, 2.13 GHz is 4-j6Ω. Value of L1 is 0.45 nH to reduce impedance seen by switch at $3^{rd}$ harmonic to approximately 4Ω.

| LTE Band 17 $3^{rd}$ Harmonic @ 710 MHz | $P_{in}$ (dBm) | $P_{3h}$ (dBm) |
|---|---|---|
| SP8T Switch in 50Ω | 26 | −87 |
| SP8T Switch in Module with Duplexer | 26 | −106 |

Power of $3^{rd}$ harmonic in module is reduced by 19 dB from performance achievable on switch alone in characteristic impedance. Target linearity performance at higher throw count switch is achieved without requiring compromise on insertion loss.

While the present teaching has been described with reference to exemplary arrangements and circuits it will be understood that it is not intended to limit the teaching of the present teaching to such arrangements as modifications can be made without departing from the spirit and scope of the present invention. In this way it will be understood that the present teaching is to be limited only insofar as is deemed necessary in the light of the appended claims.

Similarly the words comprises/comprising when used in the specification are used to specify the presence of stated features, integers, steps or components but do not preclude the presence or addition of one or more additional features, integers, steps, components or groups thereof.

What is claimed is:
1. A radio frequency (RF) circuit comprising:
a plurality of switching arms associated with corresponding RF input ports; the switching arms being controllable to be selectively activated;
a switch source impedance associated with each of the RF input ports; the switch source impedance being frequency dependent such that its value is matched to a characteristic impedance value within a first frequency range; and the value of the switch source impedance is not matched to the characteristic impedance value within a second frequency range; wherein
when an RF signal within the first frequency range is transmitted through the RF circuit, between one of the RF input ports and an a common port, an RF distortion voltage within a distortion frequency range results at the common port; and the amplitude of a resultant RF distortion voltage is lower than an RF distortion voltage if the switch source impedance is matched to the characteristic impedance within the second frequency range; and a high linearity switching arm which is configured such that it generates harmonic power in load which is lower than the harmonic power in load for the whole RF circuit;

wherein the switching arms are configured such that ratio of harmonic power in load due to the inactive switching arms when their associated RF input ports are terminated with the characteristic impedance value and the harmonic power in load for complete RF circuit when the high linearity switch arm is in on-state is less than or equal to the ratio of system characteristic impedance to the impedance at the input port of on high linearity arm at harmonic frequencies.

2. An RF circuit as claimed in claim 1, wherein the second frequency range and distortion frequency range are coincident, occurring at an integer multiple of the first frequency range.

3. An RF circuit as claimed in claim 1, wherein the distortion frequency range occurs at a sum of an integer multiple of the first frequency range and an integer multiple of the second frequency range.

4. An RF circuit as claimed in claim 1, wherein the impedance value of the source impedance is lower than the characteristic impedance value when the RF signal is outside the transmitting frequency range.

5. An RF circuit as claimed in claim 1, wherein the impedance value of the source impedance is higher than the characteristic impedance value when the RF signal is outside the transmitting frequency range.

6. An RF circuit as claimed in claim 1, wherein the common port is associated with the source impedance.

7. An RF circuit as claimed in claim 6, wherein when one of the switching arms is in an active state one or more of the other switching arms are in an inactive state.

8. An RF circuit as claimed in claim 1, wherein the RF input ports associated with the inactive switching arms are terminated with an impedance value corresponding to the characteristic impedance value.

9. An RF circuit as claimed in claim 1, wherein at least one switching arms is operably coupled to a common antenna port.

10. An RF circuit as claimed in claim 9, wherein one or more of the switching arms coupled to the common antenna port are in an inactive state when the high linearity switching arm is in an active state.

11. An RF circuit as claimed in claim 10, wherein harmonic power in load due to the switching arms in an inactive state is reduced by providing a low impedance element at the RF input port associated with the high linearity switching arm at harmonic frequencies.

12. An RF circuit as claimed in claim 10, wherein a low impedance element is coupled to the RF input port associated with the high linearity switching arm for reducing harmonic power in load due to the inactive switching arms.

13. An RF circuit as claimed in claim 11, wherein harmonic power in load due to the active and inactive switching arms is controllable by varying the characteristic impedance.

14. An RF circuit as claimed in claim 11, wherein harmonic power in load due to the active and inactive switching arms is controllable by varying the source impedance.

15. An RF circuit as claimed in claim 1, further comprising a duplexer.

16. An RF circuit as claimed in claim 13, wherein the duplexer contributes to the source impedance.

17. An RF circuit as claimed in claim 14, wherein the impedance of the duplexer is frequency dependent.

18. An RF circuit as claimed in claim 15, wherein the duplexer has a first impedance value within a transmitting frequency range associated with the RF switch.

19. An RF circuit as claimed in claim 16, wherein the duplexer has a second impedance value at out of band frequencies.

20. An RF circuit as claimed in claim 16, wherein the second impedance value is less than the first impedance value.

21. An RF circuit as claimed in claim 15, wherein the impedance of the duplexer is less than the characteristic impedance value at out of band frequencies.

22. An RF circuit as claimed in claim 15, wherein the impedance of the duplexer is matched to the characteristic impedance within an in band frequency range.

23. An RF circuit as claimed in claim 15, wherein the duplexer comprises a transmit input port, a receive input port and a common port which have associated impedances which are matched to a characteristic impedance at a pass band frequency range.

24. An RF circuit as claimed in claim 15, wherein the duplexer has an associated transmit pass band frequency range of 704-716 MHz.

25. An RF circuit as claimed in claim 15, wherein the duplexer has an associated receive pass band frequency range of 734-746 MHz.

26. An RF circuit as claimed in claim 1, wherein the respective switching arms comprise a stack of transistors.

27. An RF circuit as claimed in claim 24, wherein the dimensions of the transistors in the stack of the high linearity switching arm are larger than the transistors in the stack of the other switching arms.

28. An RF circuit as claimed in claim 15, further comprising an inductor.

29. An RF circuit as claimed in claim 26, wherein the inductor is operably coupled between the duplexer and the RF switch.

30. An RF circuit as claimed in claim 15, wherein the absolute value of sum of reactance of the inductor and reactance at a common port of the duplexer is less than reactance at the common port of duplexer.

31. An RF circuit as claimed in claim 24, wherein the dimensions and stack height for on-state switch arm are set such that distortion level contributed by an on-state switch arm with a characteristic impedance at its RF input port is lower than a system target by factor dependent on ratio of out of band impedance at the RF input port to the system characteristic impedance.

32. A semiconductor substrate having an RF circuit fabricated thereon, wherein the RF circuit comprises:

a plurality of switching arms associated with corresponding RF input ports; the switching arms being controllable to be selectively activated; and a switch source impedance associated with each of the RF input ports; the switch source impedance being frequency dependent such that its value is matched to a characteristic impedance value within a first frequency range; and the value of the switch source impedance is not matched to the characteristic impedance value within a second frequency range; wherein when an RF signal within the first frequency range is transmitted through the RF circuit, between one of the RF input ports and an a common port, an RF distortion voltage within a distortion frequency range results at the common port; and the amplitude of a resultant RF distortion voltage is lower than the RF distortion voltage if the switch source impedance is matched to the characteristic impedance within the second frequency range; and providing a high linearity switching arm which is configured such that it generates harmonic power in load which is lower than the harmonic power in load for the whole RF circuit;

wherein the switching arms are configured such that ratio of harmonic power in load due to the inactive switching arms when their associated RF input ports are terminated with the characteristic impedance value and the harmonic power in load for complete RF circuit when the high linearity switch arm is in on-state is less than or equal to the ratio of system characteristic impedance to the impedance at the input port of on high linearity arm at harmonic frequencies.

33. A method of fabricating an RF circuit, the method comprising:

providing a plurality of switching arms associated with corresponding RF input ports; the switching arms being controllable to be selectively activated;

providing a switch source impedance associated with each of the RF input ports; the switch source impedance being frequency dependent such that its value is matched to a characteristic impedance value within a first frequency range; and the value of the switch source impedance is not matched to the characteristic impedance value within a second frequency range; wherein when an RF signal within the first frequency range is transmitted through the RF circuit, between one of the RF input ports and an a common port, an RF distortion voltage within a distortion frequency range results at the common port; and the amplitude of a resultant RF distortion voltage is lower than the RF distortion voltage if the switch source impedance is matched to the characteristic impedance within the second frequency range; and providing a high linearity switching arm which is configured such that it generates harmonic power in load which is lower than the harmonic power in load for the whole RF circuit;

wherein the switching arms are configured such that ratio of harmonic power in load due to the inactive switching arms when their associated RF input ports are terminated with the characteristic impedance value and the harmonic power in load for complete RF circuit when the high linearity switch arm is in on-state is less than or equal to the ratio of system characteristic impedance to the impedance at the input port of on high linearity arm at harmonic frequencies.

34. A radio frequency (RF) circuit comprising:

a plurality of switching arms associated with corresponding RF input ports; the switching arms being controllable to be selectively activated;

a switch source impedance associated with each of the RF input ports; the switch source impedance being frequency dependent such that its value is matched to a characteristic impedance value within a first frequency range; and the value of the switch source impedance is not matched to the characteristic impedance value within a second frequency range; wherein when an RF signal within the first frequency range is transmitted through the RF circuit, between one of the RF input ports and an a common port, an RF distortion voltage within a distortion frequency range results at the common port; and the amplitude of a resultant RF distortion voltage is lower than an RF distortion voltage if the switch source impedance is matched to the characteristic impedance within the second frequency range;

a duplexer; and an inductor; wherein the absolute value of sum of reactance of the inductor and reactance at a common port of the duplexer is less than reactance at the common port of duplexer.

35. A radio frequency (RF) circuit comprising:

a plurality of switching arms associated with corresponding RF input ports; the switching arms being controllable to be selectively activated;

a switch source impedance associated with each of the RF input ports; the switch source impedance being frequency dependent such that its value is matched to a characteristic impedance value within a first frequency range; and the value of the switch source impedance is not matched to the characteristic impedance value within a second frequency range; wherein when an RF signal within the first frequency range is transmitted through the RF circuit, between one of the RF input ports and an a common port, an RF distortion voltage within a distortion frequency range results at the common port; and the amplitude of a resultant RF distortion voltage is lower than an RF distortion voltage if the switch source impedance is matched to the characteristic impedance within the second frequency range; and a duplexer which comprises an transmit input port, a receive input port and a common port which have associated impedances which are matched to a charactersitic impedance at a pass band frequency range, wherein the dimensions and stack height for on-state switch arm are set such that distortion level contributed by an on-state switch arm with a characteristic impedance at its RF input port is lower than a system target by factor dependent on ratio of out of band impedance at the RF input port to system characteristic impedance.

* * * * *